(12) United States Patent
Zhang

(10) Patent No.: US 11,322,530 B2
(45) Date of Patent: May 3, 2022

(54) IMAGE SENSOR

(71) Applicant: Samsung Electronics Co., Ltd., Suwon-si (KR)

(72) Inventor: Gang Zhang, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 224 days.

(21) Appl. No.: 16/415,064

(22) Filed: May 17, 2019

(65) Prior Publication Data

US 2019/0378865 A1 Dec. 12, 2019

(30) Foreign Application Priority Data

Jun. 7, 2018 (KR) .................. 10-2018-0065529

(51) Int. Cl.
*H01L 27/146* (2006.01)
*H01L 27/148* (2006.01)
*H01L 27/142* (2014.01)

(52) U.S. Cl.
CPC ...... *H01L 27/14605* (2013.01); *H01L 27/142* (2013.01); *H01L 27/14636* (2013.01); *H01L 27/14812* (2013.01)

(58) Field of Classification Search
CPC ............. H01L 27/14605; H01L 27/142; H01L 27/14636; H01L 27/14812
See application file for complete search history.

(56) References Cited

U.S. PATENT DOCUMENTS

| | | |
|---|---|---|
| 8,021,943 B2 | 9/2011 | Botula et al. |
| 8,492,241 B2 | 7/2013 | Cheng et al. |
| 9,048,354 B2 | 6/2015 | Park et al. |
| 9,373,656 B2 | 6/2016 | Park |
| 9,613,847 B2 | 4/2017 | Bachman et al. |
| 10,204,964 B1* | 2/2019 | Lee .................. H01L 27/14667 |
| 2018/0240847 A1 | 8/2018 | Ota et al. |
| 2019/0148423 A1 | 5/2019 | Park et al. |
| 2020/0350345 A1* | 11/2020 | Hiramatsu .......... H01L 27/1464 |

FOREIGN PATENT DOCUMENTS

| | | | |
|---|---|---|---|
| JP | WO 2016/143531 A1 | 12/2017 | |
| KR | 20190054366 A | 5/2019 | |

* cited by examiner

*Primary Examiner* — Latanya N Crawford Eason
(74) *Attorney, Agent, or Firm* — Harness, Dickey & Pierce, P.L.C.

(57) ABSTRACT

Provided is an image sensor including a semiconductor substrate having a first surface and a second surface opposite each other, an organic photoelectric conversion device on the first surface of the semiconductor substrate, a through electrode structure connected to the organic photoelectric conversion device, and a pixel separation structure extending from the first surface toward the second surface of the semiconductor substrate. The semiconductor substrate may include a photoelectric conversion region in the semiconductor substrate. The pixel separation structure may surround the photoelectric conversion region when viewed in plan. The pixel separation structure may include a separation conductive pattern and a first sidewall dielectric pattern. The first sidewall dielectric pattern may continuously extend from between the separation conductive pattern and the semiconductor substrate to between the semiconductor substrate and a sidewall of the through electrode structure. A portion of the pixel separation structure penetrated by the through electrode structure.

20 Claims, 42 Drawing Sheets

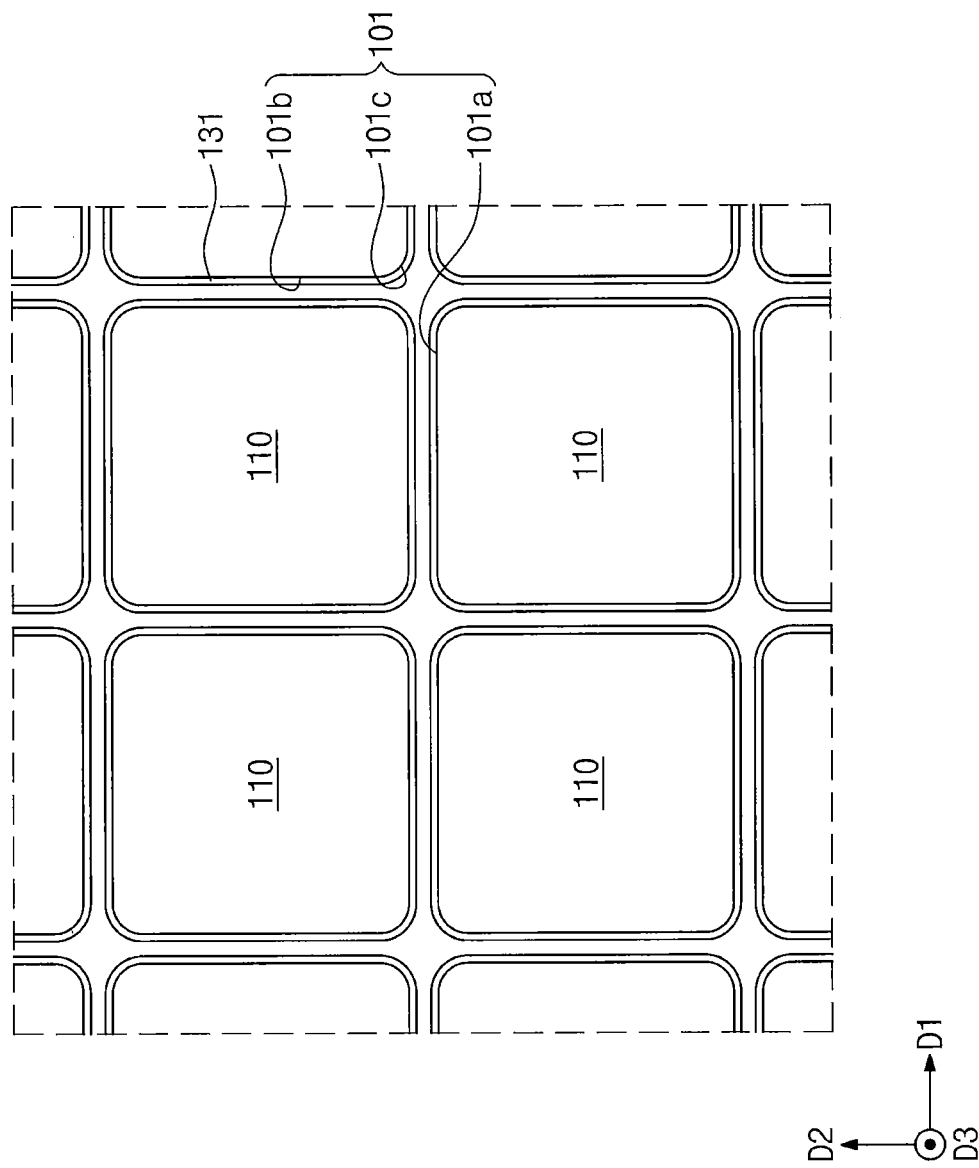

IMAGE SENSOR

CROSS-REFERENCE TO RELATED APPLICATION

This U.S. nonprovisional application claims priority under 35 U.S.C § 119 to Korean Patent Application No. 10-2018-0065529 filed on Jun. 7, 2018 in the Korean Intellectual Property Office, the entire contents of which are hereby incorporated by reference.

BACKGROUND

Inventive concepts relate to an image sensor, and more particularly, to an image sensor with improved optical characteristics.

An image sensor converts photonic images into electrical signals. Recent advances in computer and communication industries have led to strong demands in high performance image sensors in various consumer electronic devices such as digital cameras, camcorders, PCSs (Personal Communication Systems), game devices, security cameras, and medical micro-cameras.

An image sensor is classified into a charged coupled device (CCD) and a complementary metal oxide semiconductor (CMOS) image sensor. The CMOS image sensor has a simple operating method, and a size of its product may be reduced because its signal processing circuit can be integrated into a single chip. Also, the CMOS image sensor may use relatively small power consumption, which is useful in battery-powered application. Accordingly, the use of the CMOS image sensor has been rapidly increasing as a result of advanced in technology and implementation of high resolution.

SUMMARY

Some example embodiments of inventive concepts provide an image sensor with improved optical characteristics.

Features of inventive concepts are not limited to the mentioned above, and other features which have not been mentioned above will be clearly understood to those skilled in the art from the following description.

According to some example embodiments of inventive concepts, an image sensor may include a semiconductor substrate, an organic photoelectric device, a through electrode structure, and a pixel separation structure. The semiconductor substrate may have a first surface and a second surface opposite each other. The semiconductor substrate may include a photoelectric conversion region in the semiconductor substrate. The pixel separation structure may extend from the first surface toward the second surface of the semiconductor substrate. The pixel separation structure may surround the photoelectric conversion region when viewed in plan. The organic photoelectric conversion device may be on the first surface of the semiconductor substrate. A portion of the pixel separation structure may be penetrated by the through electrode structure. The through electrode structure may be connected to the organic photoelectric conversion device. The pixel separation structure may include a separation conductive pattern and a first sidewall dielectric pattern. The first sidewall dielectric pattern may continuously extend from between the separation conductive pattern and the semiconductor substrate to between the semiconductor substrate and a sidewall of the through electrode structure.

According to some example embodiments of inventive concepts, an image sensor may include a semiconductor substrate having a first surface and a second surface opposite each other, a pixel separation structure, an organic photoelectric conversion device on the first surface of the semiconductor substrate, and a through electrode structure penetrating the semiconductor substrate. The semiconductor substrate may include a plurality of photoelectric conversion regions in the semiconductor substrate. The photoelectric conversion regions may be arranged in a first direction and a second direction intersecting each other when viewed in plan. The pixel separation structure may extend from the first surface toward the second surface of the semiconductor substrate. The pixel separation structure may surround each of the plurality of photoelectric conversion regions when viewed in plan. The through electrode structure may be connected to the organic photoelectric conversion device. An outer sidewall of the through electrode structure may be connected to the pixel separation structure.

According to some example embodiments of inventive concepts, an image sensor may include a semiconductor substrate having a first surface and a second surface opposite each other, a plurality of separation conductive patterns, a first sidewall dielectric pattern, a through conductive plug, and a second sidewall dielectric pattern. The semiconductor substrate may include a trench extending from the first surface toward the second surface of the semiconductor substrate. The trench may include a plurality of first regions extending in a first direction and each having a first width, a plurality of second regions extending in a second direction intersecting the first direction and each having a second width, and a connection region between the plurality of first regions and having a third width greater than the first width. The plurality of separation conductive patterns may be in the plurality of first regions and the plurality of second regions of the trench. The first sidewall dielectric pattern may be between the plurality of separation conductive patterns and a sidewall of the trench. The through conductive plug may be in the connection region of the trench. The second sidewall dielectric pattern may surround a sidewall of the through conductive plug and may contact the plurality of separation conductive patterns.

BRIEF DESCRIPTION OF THE DRAWINGS

FIGS. 11A to 17A illustrate plan views showing a method of fabricating an image sensor according to some example embodiments inventive concepts.

FIGS. 11B to 17B illustrate cross-sectional views taken along line I-I' of FIGS. 11A to 17A, respectively, showing a method of fabricating an image sensor according to some example embodiments inventive concepts.

FIGS. 11C to 16C and 11D to 16D illustrate plan views showing a method of fabricating an image sensor according to some example embodiments inventive concepts.

DETAILED DESCRIPTION

The following will now describe in detail an image sensor according to some example embodiments inventive concepts in conjunction with the accompanying drawings.

Figure 1:
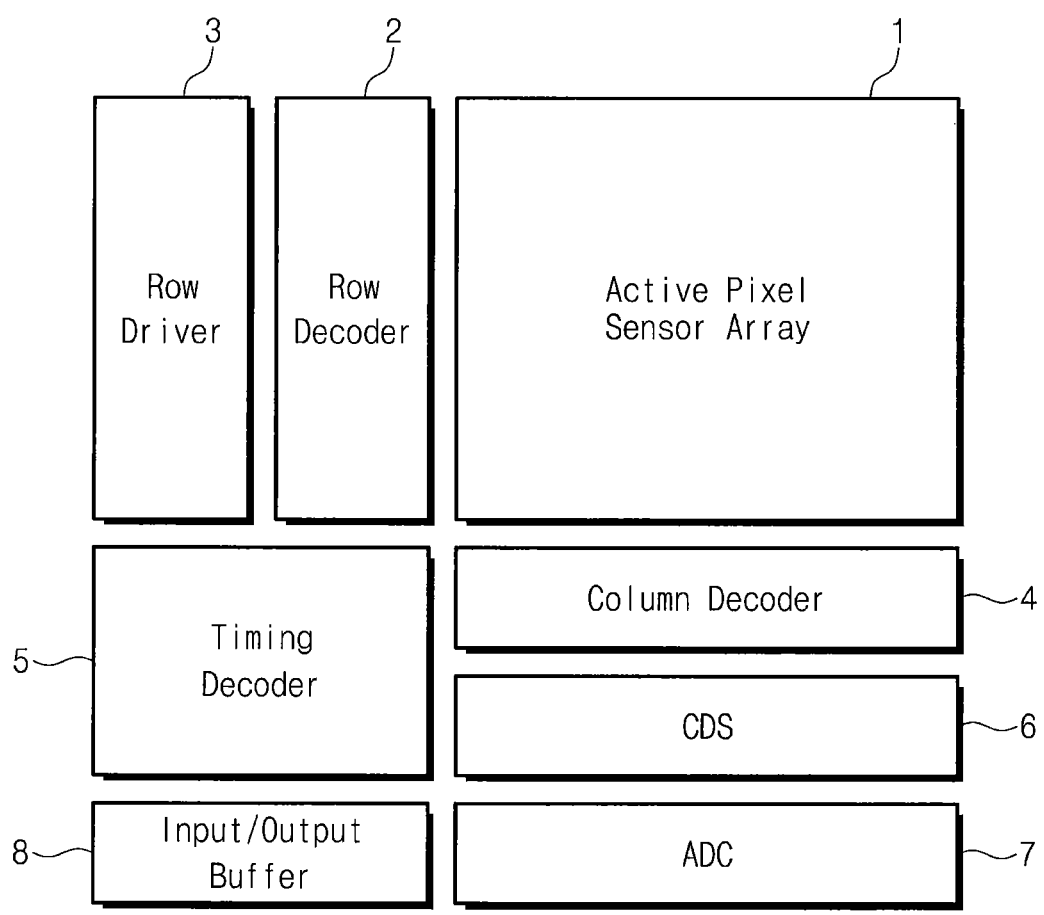
FIG. 1 illustrates a block diagram showing an image sensor according to some example embodiments inventive concepts.

FIG. 1 illustrates a schematic block diagram showing an image sensor according to exemplary embodiments of inventive concepts.

Referring to FIG. 1, an image sensor, for example, a complementary metal oxide semiconductor (CMOS) image sensor, may include an active pixel sensor array 1, a row decoder 2, a row driver 3, a column decoder 4, a timing generator 5, a correlated double sampler (CDS) 6, an analog-to-digital converter (ADC) 7, and an input/output buffer 8.

The active pixel sensor array 1 may include a plurality of two-dimensionally arranged unit pixels, each of which is configured to convert optical signals into electrical signals. The active pixel sensor array 1 may be driven by a plurality of driving signals such as a pixel selection signal, a reset signal, and a charge transfer signal from the row driver 3. The converted electrical signals may be provided to the correlated double sampler 6.

The row driver 3 may provide the active pixel sensor array 1 with several driving signals for driving several unit pixels in accordance with a decoded result obtained from the row decoder 2. In case that the unit pixels are arranged in a matrix shape, the driving signals may be provided to respective rows.

The timing generator 5 may provide timing and control signals to the row decoder 2 and the column decoder 4.

The correlated double sampler 6 may receive the electrical signals generated in the active pixel sensor array 1, and hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter (ADC) 7 may convert analog signals, which correspond to the difference level received from the correlated double sampler 6, into digital signals, and then output the converted digital signals.

The input/output buffer 8 may latch the digital signals and then sequentially output the latched digital signals to an image signal processing unit or circuit (not shown) in response to the decoded result obtained from the column decoder 4.

Figure 2A:
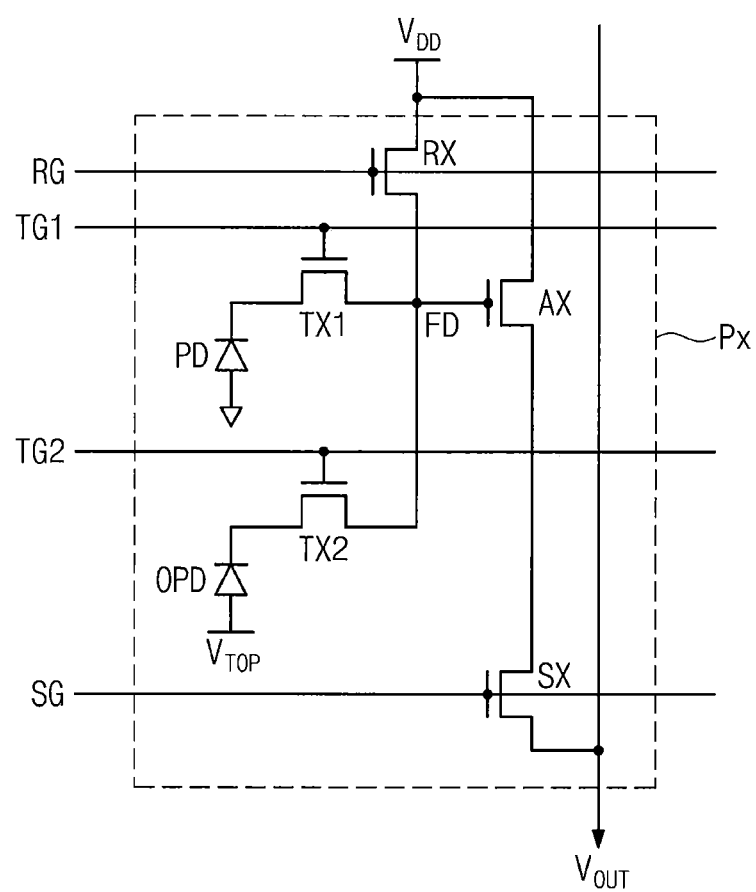
FIGS. 2A and 2B illustrate circuit diagrams showing a unit pixel of an image sensor according to some example embodiments inventive concepts.
Figure 2B:
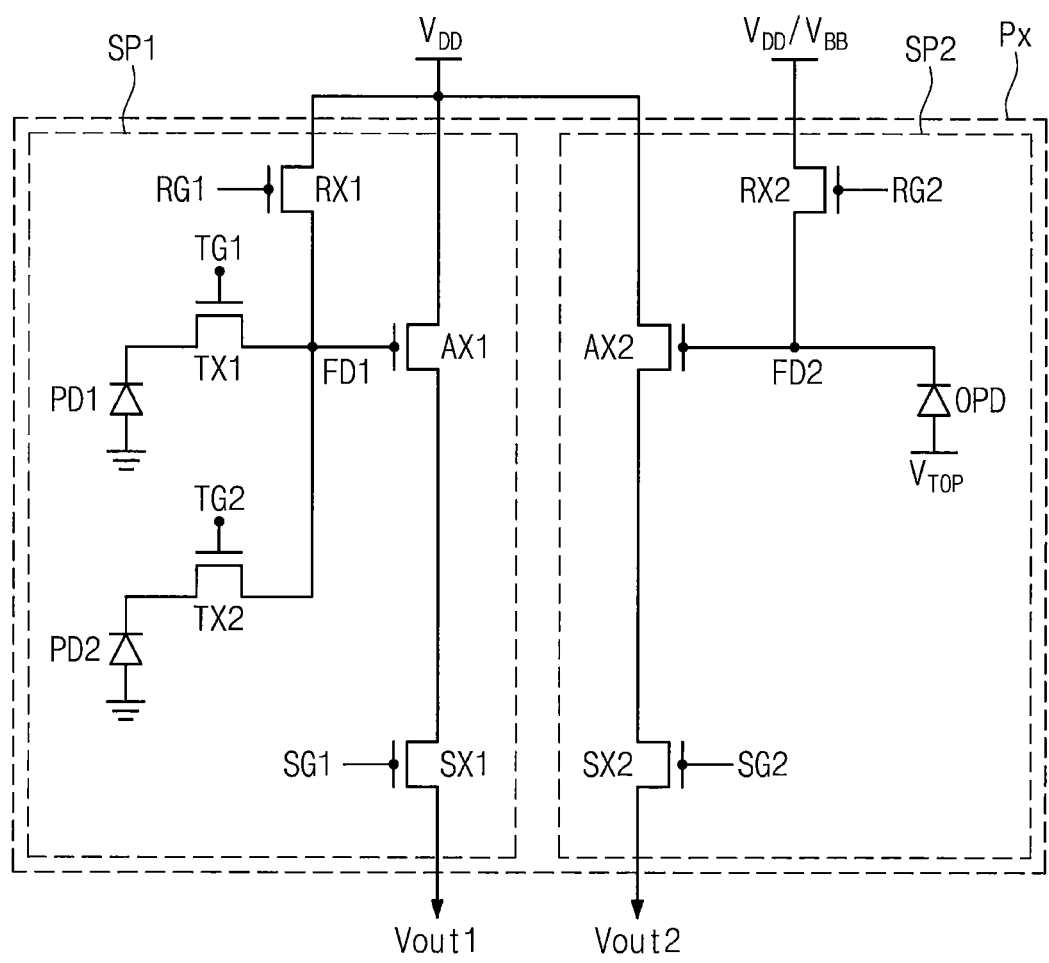

FIGS. 2A and 2B illustrate circuit diagrams showing a unit pixel of an image sensor according to some example embodiments inventive concepts.

Referring to FIG. 2A, a unit pixel Px may include a transfer transistor TX1, a second transfer transistor TX2, and logic transistors RX, SX, and AX. The logic transistors RX, SX and AX may include a reset transistor RX, a selection transistor SX, and a source follower transistor AX also referred to as a drive transistor.

The first transfer transistor TX1 may include a first transfer gate TG1 and a photoelectric conversion device PD, and the second transfer transistor TX2 may include a second transfer gate TG2 and an organic photoelectric conversion device OPD. The first and second transfer transistors TX1 and TX2 may share a charge storage node FD, which is also referred to as a floating diffusion region.

The photoelectric conversion device PD and the organic photoelectric conversion device OPD may create and accumulate photo-charges in proportion to an amount of externally incident light. In some example embodiment, the photoelectric conversion device PD may be or include one of a photo diode, a photo transistor, a photo gate, a pinned photo diode (PPD), and a combination thereof. The organic photoelectric conversion device OPD may include an organic photoelectric conversion layer. The organic photoelectric conversion layer may create photo-charges (electron-hole pairs) in proportion to an amount of incident light having a certain wavelength.

The first and second transfer transistors TX1 and TX2 may provide the charge storage node FD with charges accumulated in the photoelectric conversion device PD and the organic photoelectric conversion device OPD. The first and second transfer transistors TX1 and TX2 may be controlled by charge transfer signals provided through first and second charge transfer lines TG1 and TG2, and in accordance with the charge transfer signals applied to the first and second transfer transistors TX1 and TX2, charges may be transferred to the charge storage node FD from any one of the photoelectric conversion device PD and the organic photoelectric conversion device OPD. For example, the charge transfer signals transferred through the first and second charge transfer lines TG1 and TG2 may be complementary to each other.

The charge storage node FD may receive to accumulatively store charges generated from the photoelectric conversion device PD and the organic photoelectric conversion device OPD, and a gate electrode of the source follower transistor AX may change its electrical potential in accordance with an amount of photo-charges accumulated in the charge storage node FD.

The reset transistor RX may periodically reset the charges accumulated in the charge storage node FD. For example, a gate electrode of the reset transistor RX may be connected to a reset signal line RG to which a reset signal is provided. A drain of the reset transistor RX may be connected to the charge storage node FD, and a source of the reset transistor RX may be connected to a power voltage $V_{DD}$. When the reset transistor RX is turned on by the reset signal, the charge storage node FD may receive the power voltage $V_{DD}$ connected to the source of the reset transistor RX. Accordingly, when the reset transistor RX is turned on, the photo-charges accumulated in the charge storage node FD may be drained and then the charge storage node FD may be reset.

The source follower transistor AX may amplify a variation in electrical potential of the charge storage node FD, and may output an amplified pixel signal through the selection transistor SX to an output line $V_{OUT}$. The source follower transistor AX may be or include a source follower buffer amplifier configured to generate a source-drain current in proportion to an amount of photo-charges applied to a gate electrode. The source follower transistor AX may include a gate electrode connected to the charge storage node FD, a drain connected to the power voltage $V_{DD}$, and a source connected to a drain of the selection transistor SX.

The selection transistor SX may select a row of unit pixels to be read out. A gate electrode of the selection transistor SX may be connected to a selection line SG through which a selection signal is provided. When the selection transistor SX is turned on by the selection signal, the output line $V_{OUT}$ may output a pixel signal that is output from the source of the source follower transistor AX.

Referring to FIG. 2B, a unit pixel Px of an image sensor may include a first sub-pixel SP1 and a second sub-pixel SP2. The first and second sub-pixels SP1 and SP2 may detect lights having different wavelengths and may output electrical signals.

A first electrical signal may be obtained by sensing a light having a first wavelength or a second wavelength from the first sub-pixel SP1, and a second electrical signal may be obtained by sensing a light having a third wavelength from the second sub-pixel SP2, which third wavelength is different from the first and second wavelengths.

The first sub-pixel SP1 may include a first photoelectric conversion device PD1, a second photoelectric conversion device PD2, a first transfer transistor TX1, a second transfer transistor TX2, and a first readout circuit. The second sub-pixel SP2 may include an organic photoelectric conversion device OPD and a second readout circuit connected to the organic photoelectric conversion device OPD.

On the first sub-pixel SP1, the first and second transfer transistors TX1 and TX2 may share a first charge storage node FD1 and the first readout circuit. The first readout circuit may include a first reset transistor RX1, a first source follower transistor AX1, and a first selection transistor SX1. The first readout circuit may sense and amplify photo-charges from the first photoelectric conversion device PD1 or the second photoelectric conversion device PD2, and may output a first pixel signal or a second pixel signal to a first output line $V_{OUT1}$.

For example, the first and second photoelectric conversion devices PD1 and PD2 may generate and accumulate photo-charges in proportion to an amount of externally incident light. The first and second photoelectric conversion devices PD1 and PD2 may be or include one of a photo diode, a photo transistor, a photo gate, a pinned photo diode (PPD), and a combination thereof.

The first and second transfer transistors TX1 and TX2 may provide the first charge storage node FD1 with the charges accumulated in the first and second photoelectric conversion devices PD1 and PD2. The first and second transfer transistors TX1 and TX2 may be controlled by charge transfer signals provided through first and second charge transfer lines TG1 and TG2, and in accordance with the charge transfer signals applied to the first and second transfer transistors TX1 and TX2, charges may be transferred to the first charge storage node FD1 from any one of the first and second photoelectric conversion devices PD1 and PD2. For example, the charge transfer signals transferred through the first and second charge transfer lines TG1 and TG2 may be complementary to each other.

The first charge storage node FD1 may receive to accumulatively store charges generated from the first and second photoelectric conversion devices PD1 and PD2, and a gate electrode of the first source follower transistor AX1 may change its electrical potential in accordance with an amount of photo-charges accumulated in the first charge storage node FD1.

The first reset transistor RX1 may periodically reset the charges accumulated in the first charge storage node FD1. For example, a gate electrode of the first reset transistor RX1 may be connected to a first reset signal line RG1 to which a first reset signal is provided. A drain of the first reset transistor RX1 may be connected to the first charge storage node FD1, and a source of the first reset transistor RX1 may be connected to a power voltage $V_{DD}$. When the first reset transistor RX1 is turned on by the first reset signal, the first charge storage node FD1 may receive the power voltage $V_{DD}$ connected to the source of the first reset transistor RX1. Accordingly, when the first reset transistor RX1 is turned on, the photo-charges accumulated in the first charge storage node FD1 may be drained and then the first charge storage node FD1 may be reset.

The first source follower transistor AX1 may amplify a variation in electrical potential of the first charge storage node FD1, and may output an amplified first or second pixel signal through the first selection transistor SX1 to the first output line $V_{OUT1}$. The first source follower transistor AX1 may be or include a source follower buffer amplifier configured to generate a source-drain current in proportion to an amount of photo-charges applied to a gate electrode. The first source follower transistor AX1 may include a gate electrode connected to the first charge storage node FD1, a drain connected to the power voltage $V_{DD}$, and a source connected to a drain of the first selection transistor SX1.

The first selection transistor SX1 may select a row of first sub-pixels SP1 to be read out. A gate electrode of the first selection transistor SX1 may be connected to a first selection line SG1 from which a first selection signal is provided. When the first selection transistor SX1 is turned on by the first selection signal, the first output line $V_{OUT1}$ may output a first or second pixel signal that is output from the source of the first source follower transistor AX1.

As discussed above, the second sub-pixel SP2 may include the organic photoelectric conversion device OPD and the second readout circuit. The second readout circuit of the second sub-pixel SP2 may include a second reset transistor RX2, a second source follower transistor AX2, and a second selection transistor SX2.

The organic photoelectric conversion device OPD may include an organic photoelectric conversion layer having an organic material that produces photo-charges (electron-hole pairs) in proportion to an amount of incident light. The organic photoelectric conversion device OPD may be directly connected to a second charge storage node FD2 that stores and detects photo-charges. A difference in voltage applied to opposite ends of the organic photoelectric conversion device OPD may cause the second charge storage node FD2 to store electrons or holes. In other words, when a voltage $V_{TOP}$ is applied to one of the terminals of the photoelectric conversion element OPD, the generated electrons or holes may be transferred to and accumulated in the charge storage node FD in FIG. 2A (or FD2 in FIG. 2B).

The second reset transistor RX2 may periodically reset the charges accumulated in the second charge storage node FD2. For example, a gate electrode of the second reset transistor RX2 may be connected to a second reset signal line RG2 to which a second reset signal is provided. A drain of the second reset transistor RX2 may be connected to the second charge storage node FD2, and a source of the second reset transistor RX2 may be connected to a reset voltage $V_{DD}/V_{BB}$. For example, the reset voltage $V_{DD}/V_{BB}$ may be a power voltage $V_{DD}$ or a ground voltage $V_{BB}$. When the second reset transistor RX2 is turned on by the second reset signal, the reset voltage $V_{DD}/V_{BB}$ may be transferred to the second charge storage node FD2. Accordingly, when the second reset transistor RX2 is turned on, the photo-charges accumulated in the second charge storage node FD2 may be drained and then the second charge storage node FD2 may be reset.

The second source follower transistor AX2 may amplify a variation in electrical potential of the second charge storage node FD2, and may output an amplified third pixel signal through the second selection transistor SX2 to a second output line $V_{OUT2}$. The second source follower transistor AX2 may be or include a source follower buffer amplifier configured to generate a source-drain current in proportion to an amount of photo-charges applied to a gate electrode. The second source follower transistor AX2 may include a gate electrode connected to the second charge storage node FD2, a drain connected to the power voltage $V_{DD}$, and a source connected to a drain of the second selection transistor SX2.

The second selection transistor SX2 may select a row of second sub-pixels SP2 to be read out. A gate electrode of the second selection transistor SX2 may be connected to a second selection line SG2 from which a second selection signal is provided. When the second selection transistor SX2 is turned on by the second selection signal, the second output line $V_{OUT2}$ may output a second pixel signal that is output from the source of the second source follower transistor AX2.

Figure 3:
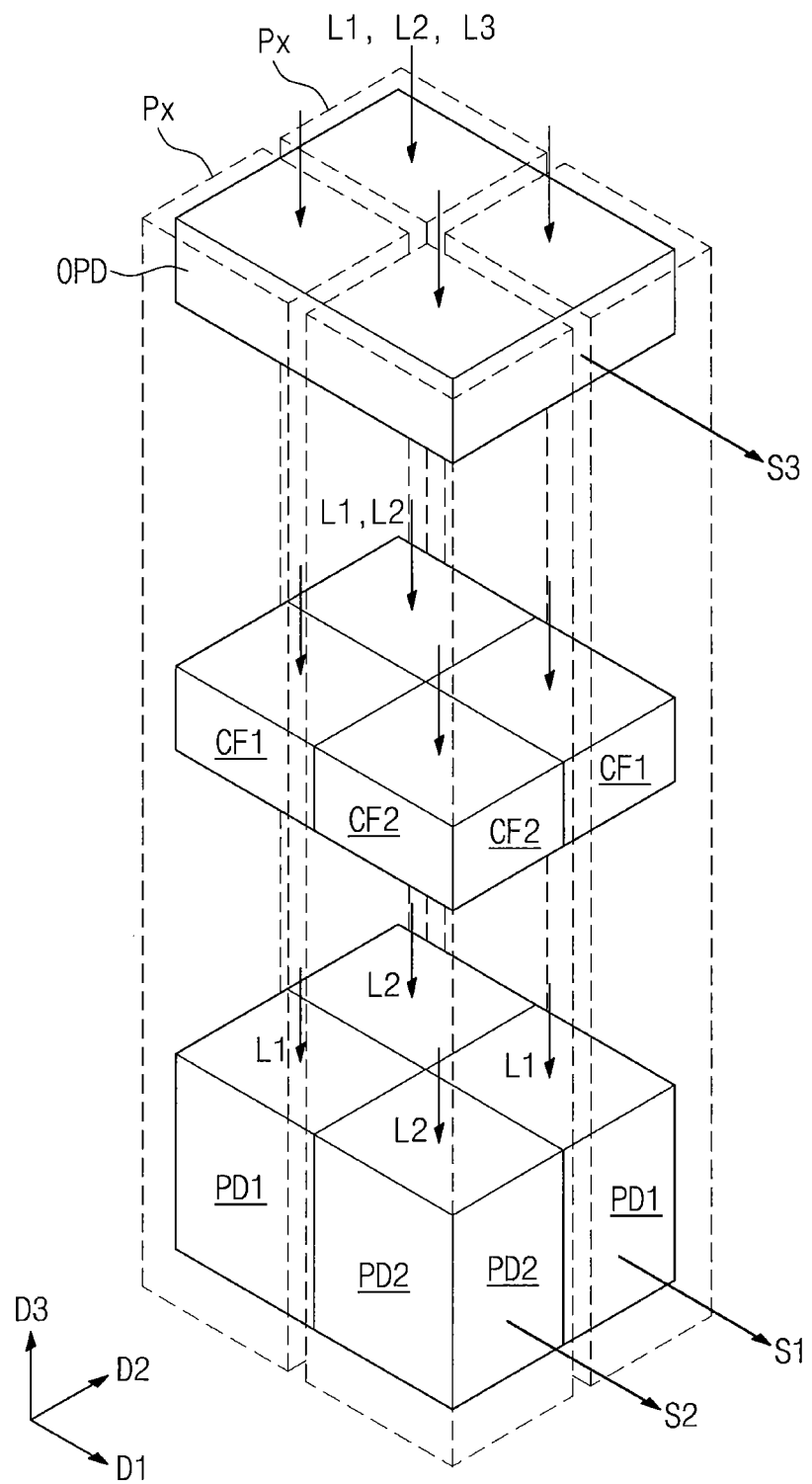
FIG. 3 illustrates a block diagram showing an image sensor according to some example embodiments inventive concepts.

FIG. 3 illustrates a block diagram showing an image sensor according to some example embodiments inventive concepts.

Referring to FIG. 3, an image sensor may include a plurality of unit pixels Px that are two-dimensionally arranged along a first direction D1 and a second direction D2 intersecting the first direction D1. Each of the unit pixels Px may have a structure in which at least two photoelectric conversion devices are stacked in a third direction D3 perpendicular to the first and second directions D1 and D2.

Each of the unit pixels Px may include one of first and second photoelectric conversion devices PD1 and PD2, one of first and second color filter CF1 and CF2, and an organic photoelectric conversion device OPD.

The first and second photoelectric conversion devices PD1 and PD2 may be provided in a semiconductor substrate and may be arranged in a matrix shape. The first and second photoelectric conversion devices PD1 and PD2 may be arranged in a zigzag fashion.

The organic photoelectric conversion device OPD may be stacked on the first and second photoelectric conversion devices PD1 and PD2. For example, when viewed in plan, the organic photoelectric conversion device OPD may commonly overlap the first and second photoelectric conversion devices PD1 and PD2.

The first color filters CF1 may be provided between the first photoelectric conversion devices PD1 and the organic photoelectric conversion device OPD, and the second color filters CF2 may be provided between the second photoelectric conversion devices PD2 and the organic photoelectric conversion device OPD.

In some example embodiments, the organic photoelectric conversion device OPD may receive first, second, and third incident lights L1, L2, and L3 respectively having first, second, and third wavelengths. The first and second photoelectric conversion devices PD1 and PD2 and the organic photoelectric conversion device OPD may receive lights having different wavelengths from each other, and may generate photo-charges in proportion to an amount of incident lights.

The first photoelectric conversion device PD1 may generate first photo-charges corresponding to the first incident light L1 having the first wavelength. The second photoelectric conversion device PD2 may generate second photo-charges corresponding to the second incident light L2 having the second wavelength. The organic photoelectric conversion device OPD may generate third photo-charges corresponding to the third incident light L3 having the third wavelength. The first wavelength may be longer than the third wavelength, and the second wavelength may be shorter than the third wavelength. For example, the first incident light L1 having the first wavelength may exhibit a red color, the second incident light L2 having the second wavelength may exhibit a blue color, and the third incident light L3 having the third wavelength may exhibit a green color.

The first light L1 having the first wavelength may be incident on the first photoelectric conversion device PD1 after passing through the organic photoelectric conversion device OPD and the first color filter CF1, and the second incident light L2 having the second wavelength may be incident on the second photoelectric conversion device PD2 after passing through the organic photoelectric conversion device OPD and the second color filter CF2. The third incident light L3 having the third wavelength may be incident on the organic photoelectric conversion device OPD.

The unit pixel Px including the first photoelectric conversion device PD1 may generate a first pixel signal S1 corresponding to the first incident light L1 having the first wavelength, and the unit pixel Px including the second photoelectric conversion device PD2 may generate a second pixel signal S2 corresponding to the second incident light L2 having the second wavelength. In addition, the organic photoelectric conversion device OPD may generate a third pixel signal S3 corresponding to the third incident light L3 having the third wavelength. For example, the first photoelectric conversion device PD1 may generate photo-charges corresponding to a red light. The second photoelectric conversion device PD2 may generate photo-charges corresponding to a blue light. The organic photoelectric conversion device OPD may generate photo-charges corresponding to a green light.

Figure 4:
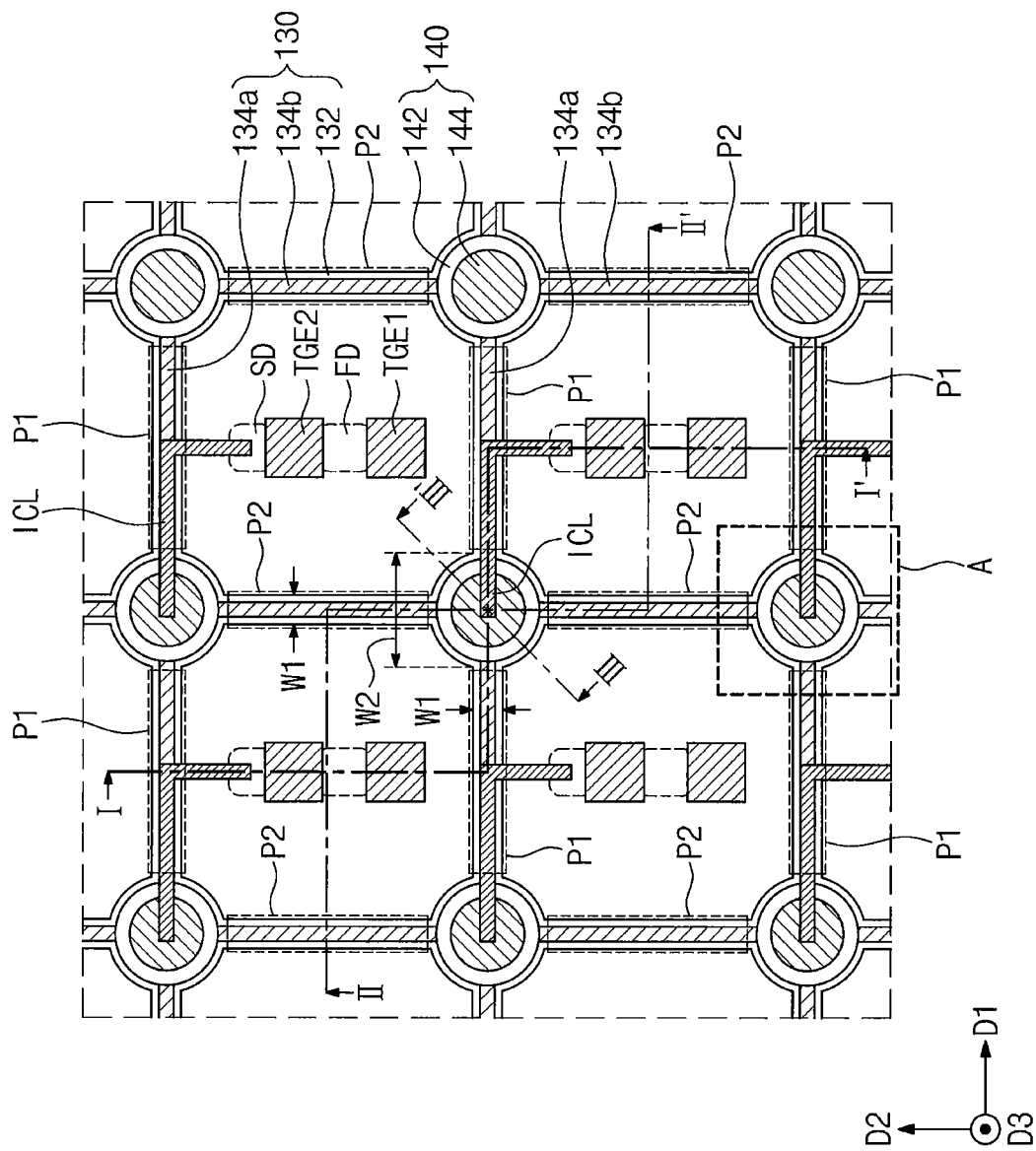
FIG. 4 illustrates a plan view showing an image sensor according to some example embodiments inventive concepts.
Figure 5A:
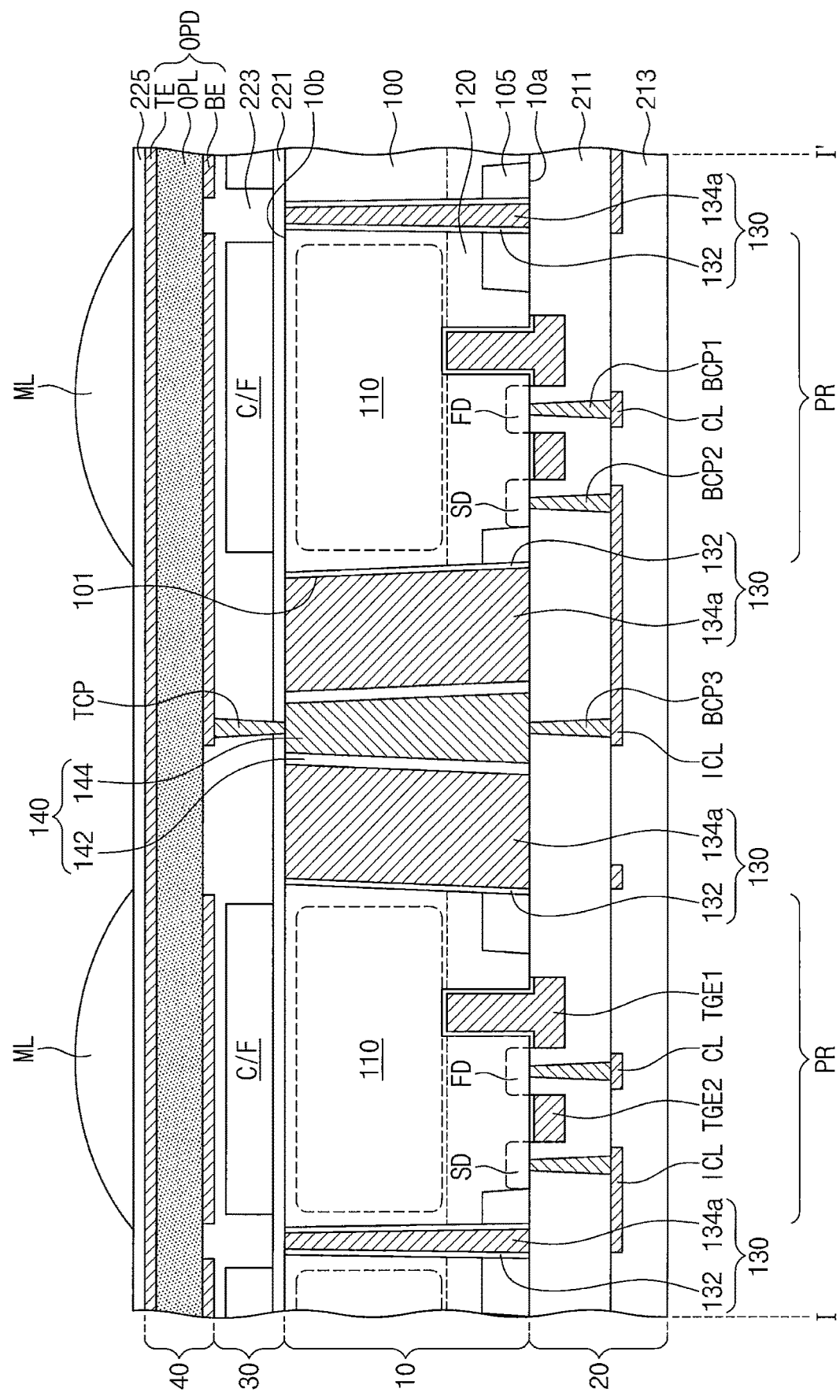
FIGS. 5A, 5B, and 5C illustrate cross-sectional views respectively taken along lines I-I', II-II', III-III' and of FIG. 4, showing an image sensor according to some example embodiments inventive concepts.
Figure 5B:
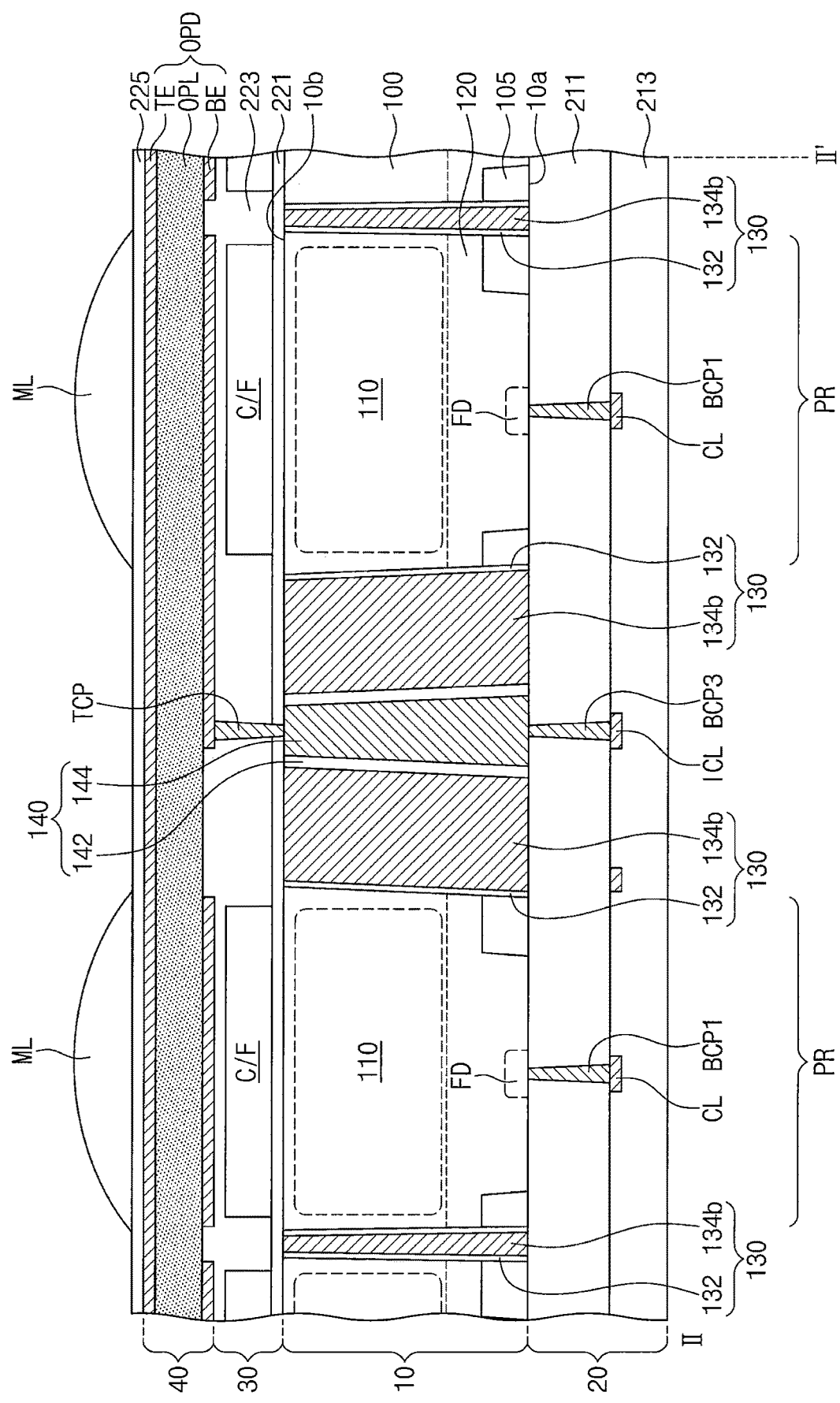
Figure 5C:
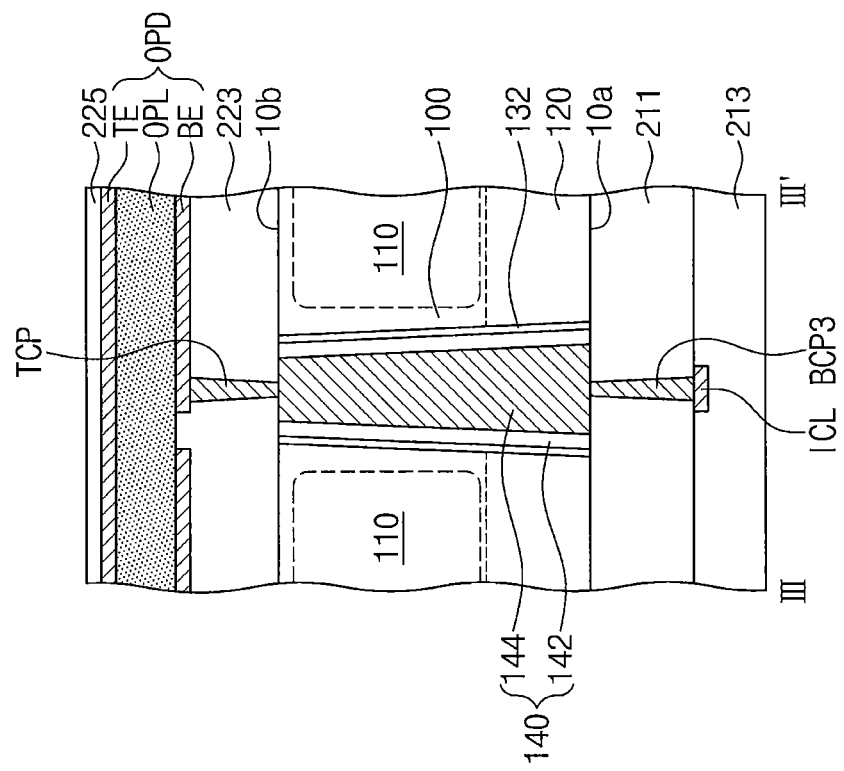

FIG. 4 illustrates a plan view showing an image sensor according to some example embodiments inventive concepts. FIGS. 5A, 5B, and 5C illustrate cross-sectional views respectively taken along lines I-I', II-II', and III-III' of FIG. 4, showing an image sensor according to some example embodiments inventive concepts.

Referring to FIGS. 4, 5A, 5B, and 5C, an image sensor according to some example embodiments inventive concepts may include a first photoelectric conversion layer 10, a readout circuit layer 20, a color filter layer 30, and a second photoelectric conversion layer 40. In some example embodiments, when viewed in cross-section, the first photoelectric conversion layer 10 may be disposed between the readout circuit layer 20 and the color filter layer 30, and the color filter layer 30 may be disposed between the first photoelectric conversion layer 10 and the second photoelectric conversion layer 40.

The first photoelectric conversion layer 10 may include a semiconductor substrate 100 and photoelectric conversion regions 110 provided in the semiconductor substrate 100. The semiconductor substrate 100 may have a first surface (or a front surface) 10a and a second surface (or a rear surface) 10b opposite the first surface 10a. The photoelectric conversion regions 110 may be impurity regions doped with impurities having a second conductivity (e.g., n-type) opposite to that of the semiconductor substrate 100. The photoelectric conversion regions 110 may convert externally incident light into electrical signals.

The readout circuit layer 20 may be disposed on the first surface 10a of the semiconductor substrate 100. The readout circuit layer 20 may include readout circuits (e.g., metal oxide semiconductor (MOS) transistors) connected to the first and second photoelectric conversion layers 10 and 40. The readout circuit layer 20 may process electrical signals that are converted in the first and second photoelectric conversion layers 10 and 40. For example, the first surface 10a of the semiconductor substrate 100 may be provided thereon with MOS transistors and with connection lines ICL and CL connected to the MOS transistors. The connection lines ICL and CL may be disposed in lower dielectric layers 211 and 213. In some example embodiments, the connection lines ICL and CL may be freely arranged without being influenced by arrangement of the photoelectric conversion regions 110.

The color filter layer 30 may be disposed on the second surface 10b of the semiconductor substrate 100. The color filter layer 30 may include first and second color filters C/F arranged in a zigzag fashion as discussed with reference to FIG. 3. The first and second color filters C/F may be or include red and blue color filters.

The second photoelectric conversion layer 40 may include top and bottom electrodes TE and BE and also include an organic photoelectric conversion layer OPL between the top and bottom electrodes TE and BE. The second photoelectric conversion layer 40 may be provided thereon with microlenses ML that focus externally incident light and are arranged in a matrix shape.

For example, the semiconductor substrate 100 may be or include an epitaxial layer formed on a bulk silicon substrate having a first conductivity (e.g., p-type) the same as that of the epitaxial layer. For another example, the semiconductor substrate 100 may be or include a p-type epitaxial layer that remains after a bulk silicon substrate is removed in a fabrication process for an image sensor. For another example, the semiconductor substrate 100 may be or include a bulk semiconductor substrate having a well region of the first conductivity.

The semiconductor substrate 100 may include a deep trench 101 extending from the first surface 10a toward the second surface 10b. The deep trench 101 may define a plurality of pixel regions PR. The deep trench 101 may include a plurality of first regions extending in a first direction D1 and each having a first width, a plurality of second regions extending in a second direction D2 intersecting the first direction and each having a second width the same as or similar to the first width, and a plurality of connection regions between the first regions and between the second regions and each having a third width greater than the first or second width.

A pixel separation structure 130 and through electrode structures 140 may be provided in the deep trench 101 of the semiconductor substrate 100. For example, the semiconductor substrate 100 may include a plurality of pixel regions PR defined by the pixel separation structure 130 and the through electrode structures 140. The plurality of pixel regions PR may be arranged in a matrix shape along the first and second directions D1 and D2 intersecting each other. Each pixel region PR of the semiconductor substrate 100 may have sidewalls opposite each other in the first direction D1 and other sidewalls opposite each other in the second direction D2. In some example embodiments, the pixel regions PR may be completely separated from each other by the pixel separation structure 130 and the through electrode structure 140, without a semiconductor material between the pixel regions PR.

The pixel separation structure 130 may vertically extend from the first surface 10a toward the second surface 10b of the semiconductor substrate 100. When viewed in plan, the pixel separation structure 130 may surround each of the pixel regions PR. Each of the pixel regions PR may be provided between a pair of first parts P1 which will be discussed below and between a pair of second parts P2 which will be discussed below.

When viewed in plan, the pixel separation structure 130 may include first parts P1 extending in the first direction D1 and spaced apart from each other in the second direction D2, and also include second parts P2 extending in the second direction D2 and spaced apart from each other in the first direction D1. The pixel separation structure 130 may extend having a first width W1 in the first and second directions D1 and D2. The pixel separation structure 130 may have a wide upper width adjacent to the first surface 10a of the semiconductor substrate 100 and a narrow lower width adjacent to the second surface 10b of the semiconductor substrate 100. The pixel separation structure 130 may have a width that gradually decreases as approaching the second surface 10b from the first surface 10a of the semiconductor substrate 100.

In some example embodiments, the pixel separation structure 130 may include a first sidewall dielectric pattern 132 and separation conductive patterns 134a and 134b.

The first sidewall dielectric pattern 132 may continuously extend along the first and second directions D1 and D2, and may entirely cover sidewalls of the semiconductor substrate 100. The first sidewall dielectric pattern 132 may be formed of an insulating material whose refractive index is less than that of the semiconductor substrate 100 (e.g., silicon). The first sidewall dielectric pattern 132 may include, for example, a silicon oxide layer, a silicon nitride layer, a silicon oxynitride layer, or a combination thereof.

The separation conductive patterns 134a and 134b may be provided in the first sidewall dielectric pattern 132. The separation conductive patterns 134a and 134b may extend from the first surface 10a toward the second surface 10b of the semiconductor substrate 100. The separation conductive patterns 134a and 134b may include polysilicon doped with no impurities, polysilicon doped with impurities having the first conductivity, or metal (e.g., tungsten or aluminum). In some example embodiments, when an image sensor is operated, the separation conductive patterns 134a and 134b may be supplied with a certain voltage so as to reduce the occurrence of dark current resulting from defects present on the sidewalls of the semiconductor substrate 100.

The separation conductive patterns 134a and 134b may include first separation conductive patterns 134a extending in the first direction D1 and each having a first width, and also include second separation conductive patterns 134b extending in the second direction D2 and each having the first width. The first separation conductive patterns 134a may be spaced apart in the first direction D1 from each other across the through electrode structure 140, and the second separation conductive patterns 134b may be spaced apart in the second direction D2 from each other across the through electrode structure 140. The first sidewall dielectric pattern 132 may fill spaces between the semiconductor substrate 100 and opposite sidewalls of each of the first and second separation conductive patterns 134a and 134b.

The separation conductive patterns 134a and 134b may be connected in the first and second directions D1 and D2 to the through electrode structure 140. For example, the separation conductive patterns 134a and 134b may contact portions of the through electrode structure 140.

The semiconductor substrate 100 may be provided therein with the through electrode structures 140 that correspond to the pixel regions PR. As shown in FIG. 4, each of the through electrode structures 140 may be provided between four pixel regions PR adjacent to each other. For example, when viewed in plan, the through electrode structures 140 may be adjacent to corners of each pixel region RR. The through electrode structures 140 may penetrate portions of the pixel separation structure 130, and when viewed in plan, may be connected in the first and second directions D1 and D2 to the pixel separation structure 130. Each of the through electrode structures 140 may have a width that decreases as approaching the second surface 10b of the semiconductor substrate 100.

In some example embodiments, each of the through electrode structures 140 may include a through conductive plug 144 and a second sidewall dielectric pattern 142 surrounding a sidewall of the through conductive plug 144.

The second sidewall dielectric pattern 142 may directly contact portions of the first sidewall dielectric pattern 132 and portions of the first and second separation conductive patterns 134a and 134b. The second sidewall dielectric pattern 142 may be formed of an insulating material whose refractive index is less than that of the semiconductor substrate 100 (e.g., silicon). The second sidewall dielectric pattern 142 may include, for example, a silicon oxide layer, a silicon nitride layer, a silicon oxynitride layer, or a combination thereof. For example, the second sidewall dielectric pattern 142 may have a thickness greater than that of the first sidewall dielectric pattern 132.

The through conductive plug 144 may include a different conductive material from that of the separation conductive patterns 134a and 134b. The through conductive plug 144 may include, for example, metal or polysilicon that is doped with impurities having the second conductivity. For example, the through conductive plug 144 may have a second width greater than the first width of each of the first and second separation conductive patterns 134a and 134b. In some example embodiments, the first and second sidewall dielectric patterns 132 and 142 may fill a space between the through conductive plug 144 and a portion of the sidewall of the semiconductor substrate 100.

The semiconductor substrate 100 may be provided therein with the photoelectric conversion regions 110 that correspond to the pixel regions PR. The photoelectric conversion regions 110 may generate photo-charges in proportion to an intensity of incident light. The photoelectric conversion regions 110 may be formed by implanting the semiconductor substrate 100 with impurities having the second conductivity opposite to that of the semiconductor substrate 100. A photodiode may be formed at a junction between the semiconductor substrate 100 having the first conductivity and the photoelectric conversion region 110 having the second conductivity. In some example embodiments, each of the photoelectric conversion regions 110 may have a difference in concentration between a site adjacent to the first surface 10a of the semiconductor substrate 100 and another site adjacent to the second surface 10b of the semiconductor substrate 100, and as a result, may have a potential slope between the first and second surfaces 10a and 10b of the semiconductor substrate 100. For example, each of the photoelectric conversion regions 110 may include a plurality of vertically stacked impurity sections.

In each of the pixel regions PR, a device isolation layer 105 may be disposed adjacent to the first surface 10a of the semiconductor substrate 100. The device isolation layer 105 may define active sections on the semiconductor substrate 100. The device isolation layer 105 may be formed in a well impurity region 120. The device isolation layer 105 may have a bottom surface located in the well impurity region 120. The device isolation layer 105 may be an impurity region having the same conductivity as that of the well impurity region 120. In such cases, the device isolation layer 105 may have an impurity concentration greater than that of the well impurity region 120.

In each of the pixel regions PR, the first surface 10a of the semiconductor substrate 100 may be provided thereon with first and second transfer gate electrodes TGE1 and TGE2 and with readout circuits discussed with reference to FIG. 2A or 2B.

When viewed in plan, the first transfer gate electrode TGE1 may be located on a central portion of each pixel region PR. The first transfer gate electrode TGE1 may include a lower portion inserted into the well impurity region 120, and also include an upper portion connected to the lower portion and protruding upward above the first surface 10a of the semiconductor substrate 100. The first transfer gate electrode TGE1 may penetrate a portion of the well impurity region 120. A gate dielectric layer may be interposed between the first transfer gate electrode TGE1 and the semiconductor substrate 100.

The first surface 10a of the semiconductor substrate 100 may be provided thereon with the second transfer gate electrode TGE2 spaced apart from the first transfer gate electrode TGE1. A gate dielectric layer may be interposed between the second transfer gate electrode TGE2 and the semiconductor substrate 100. in some example embodiments, the first and second transfer gate electrodes TGE1 and TGE2 are illustrated as being disposed on the semiconductor substrate 100, but the second transfer gate electrode TGE2 may not be provided.

A floating diffusion region FD may be provided in the well impurity region 120 between the first and second transfer gate electrodes TGE1 and TGE2. The floating diffusion region FD may be formed by doping the semiconductor substrate 100 with impurities whose conductivity is opposite to that of the well impurity region 120. The floating diffusion region FD may be, for example, an n-type impurity region.

A charge storage impurity region SD may be provided in the well impurity region 120 on a side of the second transfer gate electrode TGE2, while being spaced apart from the floating diffusion region FD. The charge storage impurity region SD may be an n-type impurity region.

A first lower dielectric layer 211 may be disposed on the first surface 10a of the semiconductor substrate 100, and may cover the first and second transfer gate electrodes TGE1 and TGE2 and also cover MOS transistors constituting readout circuits.

A plurality of bottom contact plugs BCP1, BCP2, and BCP3 may be disposed in the first lower dielectric layer 211. For example, a first bottom contact plug BCP1 may be coupled to the floating diffusion region FD, and a second bottom contact plug BCP2 may be coupled to the charge storage impurity region SD. A third bottom contact plug BCP3 may be coupled to the through conductive plug 144.

The first bottom contact plug BCP1 may be electrically connected through the connection line CL to a reset transistor (see RX of FIG. 2A) and a source follower transistor (see AX of FIG. 2A). The second bottom contact plug BCP2 may be connected through the connection line ICL to the third bottom contact plug BCP3. In such cases, the through conductive plug 144 may be connected to the charge storage impurity region SD through the connection line ICL, the second bottom contact plug BCP2, and the third bottom contact plug BCP3.

A second lower dielectric layer 213 may be disposed on the first lower dielectric layer 211, covering the connection lines CL and ICL. The first and second lower dielectric layers 211 and 213 may include, for example, one or more of silicon oxide, silicon nitride, and silicon oxynitride.

A buffer dielectric layer 221 may be disposed on the second surface 10b of the semiconductor substrate 100. The buffer dielectric layer 221 may limit and/or prevent the photoelectric conversion regions 110 from receiving charges (e.g., electrons or holes) resulting from defects present on the second surface 10b of the semiconductor substrate 100. The buffer dielectric layer 221 may include metal oxide such as aluminum oxide and/or hafnium oxide.

The buffer dielectric layer 221 may be provided thereon with the color filters C/F that correspond to the pixel regions PR. The color filters C/F may include first color filters and second color filters having different colors from those of the first color filters. A first upper dielectric layer 223 may be provided on the buffer dielectric layer 221, covering the color filters C/F.

Top contact plugs TCP may be provided to penetrate the first upper dielectric layer 223 and the buffer dielectric layer 221 and to have connection with corresponding through conductive plugs 144. Each of the top contact plugs TCP may include a barrier metal layer and a metal layer. The barrier metal layer may be formed of metal nitride, for example, titanium nitride, tantalum nitride, tungsten nitride, hafnium nitride, or zirconium nitride. The metal layer may be formed of tungsten, copper, hafnium, zirconium, titanium, tantalum, aluminum, ruthenium, palladium, platinum, cobalt, nickel, conductive metal nitride, or a combination thereof.

The bottom electrodes BE may be provided on the first upper dielectric layer 223. When viewed in plan, the bottom electrodes BE may be disposed to correspond to the pixel regions PR and may be spaced apart from each other.

The bottom electrodes BE may include a transparent conductive material. For example, the bottom electrodes BE may include one or more of ITO (indium tin oxide), IZO (indium zinc oxide), ZnO (zinc oxide), $SnO_2$, ATO (antimony-doped tin oxide), AZO (aluminum-doped zinc oxide), GZO (gallium-doped zinc oxide), $TiO_2$, and FTO (fluorine-doped tin oxide).

Each of the bottom electrodes BE may be electrically connected to the charge storage impurity region SD through the top contact plug TCP, the through conductive plug 144, the second and third bottom contact plugs BCP2 and BCP3, and the connection line ICL. In some example embodiments, when the second transfer gate electrode TGE2 is not provided, the connection line ICL may be connected through the first bottom contact plug BCP1 to the floating diffusion region FD.

The organic photoelectric conversion layer OPL may be disposed on the bottom electrodes BE. The organic photoelectric conversion layer OPL may selectively absorb a light having a specific wavelength, causing photoelectric conversion. The organic photoelectric conversion layer OPL may include a p-type organic semiconductor material and an n-type organic semiconductor material, which p-type and n-type semiconductor materials may form a p-n junction. In some example embodiments, the organic photoelectric conversion layer OPL may include quantum dots or chalcogenide.

The top electrode TE may be provided on the organic photoelectric conversion layer OPL. The top electrode TE may include a transparent conductive material, and may entirely cover the pixel regions PR.

A second upper dielectric layer 225 may be disposed on the top electrode TE, and the micro-lenses ML may be disposed on the second upper dielectric layer 225. The micro-lenses ML may be arranged to correspond to the pixel regions PR, and may have convex shapes to focus incident lights.

Figure 6A:
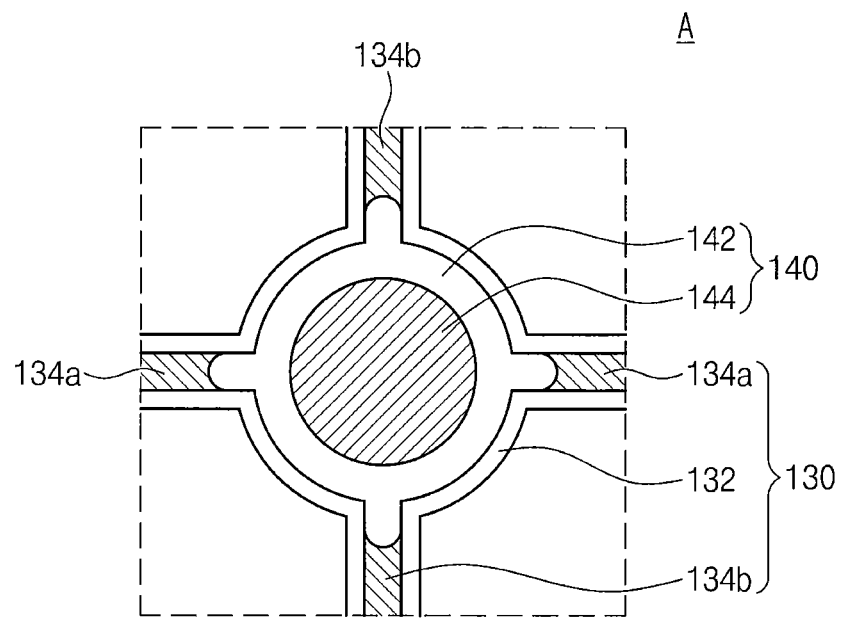
FIGS. 6A, 6B, and 6C illustrate plan views of section A depicted in FIG. 4, showing an image sensor according to some example embodiments inventive concepts.
Figure 6B:
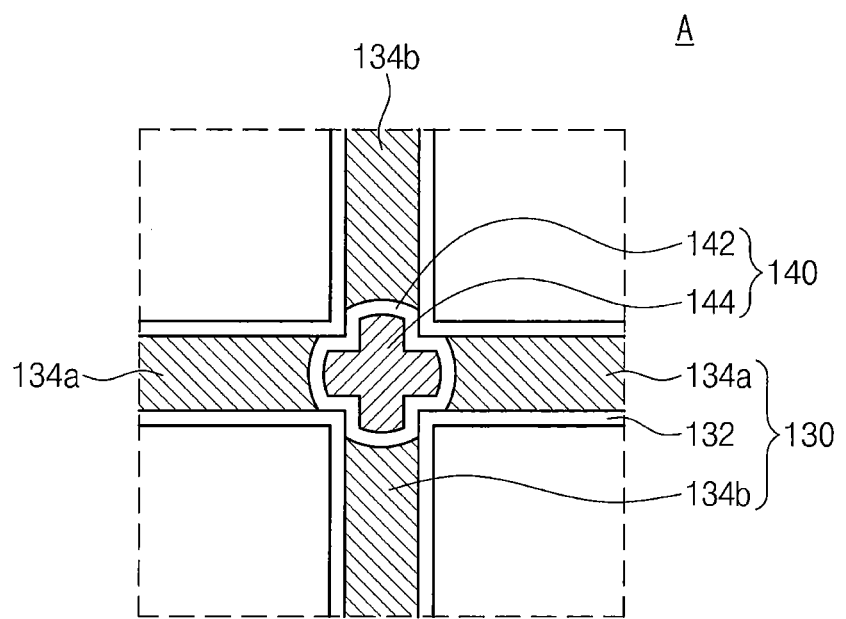
Figure 6C:
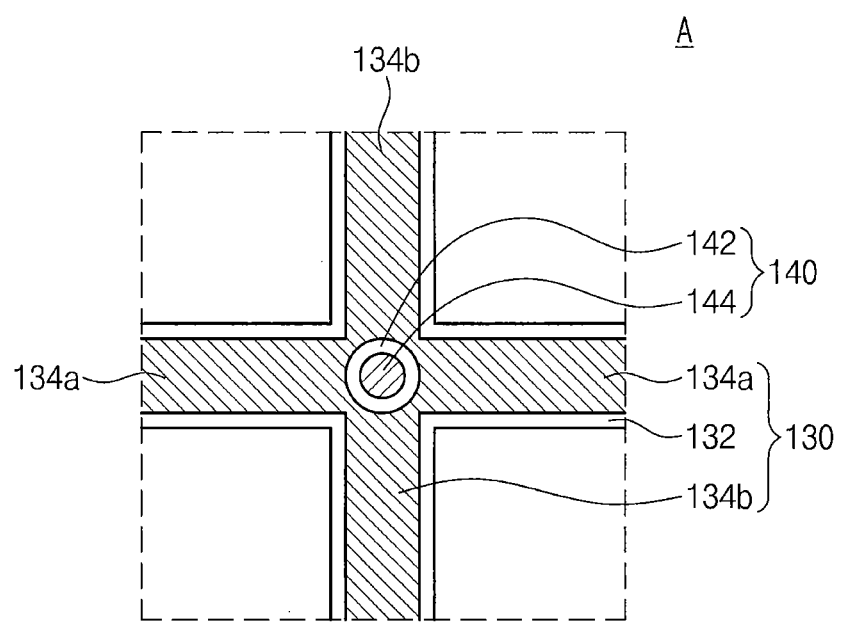

FIGS. 6A, 6B, and 6C illustrate plan views of section A depicted in FIG. 4, showing an image sensor according to some example embodiments inventive concepts. For brevity of description, technical features the same as those discussed with reference to FIGS. 4, 5A, 5B, and 5C will be omitted, and a difference thereof will be explained.

Referring to FIG. 6A, the pixel separation structure 130 may include the first sidewall dielectric pattern 132, the first separation conductive patterns 134a extending in the first direction D1, and the second separation conductive patterns 134b extending in the second direction D2. Each of the first and second separation conductive patterns 134a and 134b may have a round sidewall adjacent to the through electrode structure 140.

In the through electrode structures 140, the second sidewall dielectric pattern 142 may surround the sidewall of the through conductive plug 144, and when viewed in plan, may include first protrusions extending in the first direction D1 toward the first separation conductive patterns 134a and second protrusions extending in the second direction D2 toward the second separation conductive patterns 134b.

Referring to FIG. 6B, when viewed in plan, the through conductive plug 144 may include first protrusions extending in the first direction D1 toward the first separation conductive patterns 134a and second protrusions extending in the second direction D2 toward the second separation conductive patterns 134b.

Referring to FIG. 6C, the pixel separation structure 130 may include the first sidewall dielectric pattern 132 and the separation conductive patterns 134a and 134b. The separation conductive patterns 134a and 134b may include the first separation conductive patterns 134a extending in the first direction D1, and also include the second separation conductive patterns 134b running across the first separation conductive patterns 134a and extending in the second direction D2, which first and second separation conductive patterns 134a and 134b may be connected to each other.

The through electrode structures 140 may be correspondingly disposed at intersections between the first and second separation conductive patterns 134a and 134b. The through electrode structure 140 may have a width less than those of the separation conductive patterns 134a and 134b, and when viewed in plan, may be surrounded by the separation conductive patterns 134a and 134b.

Figure 7:
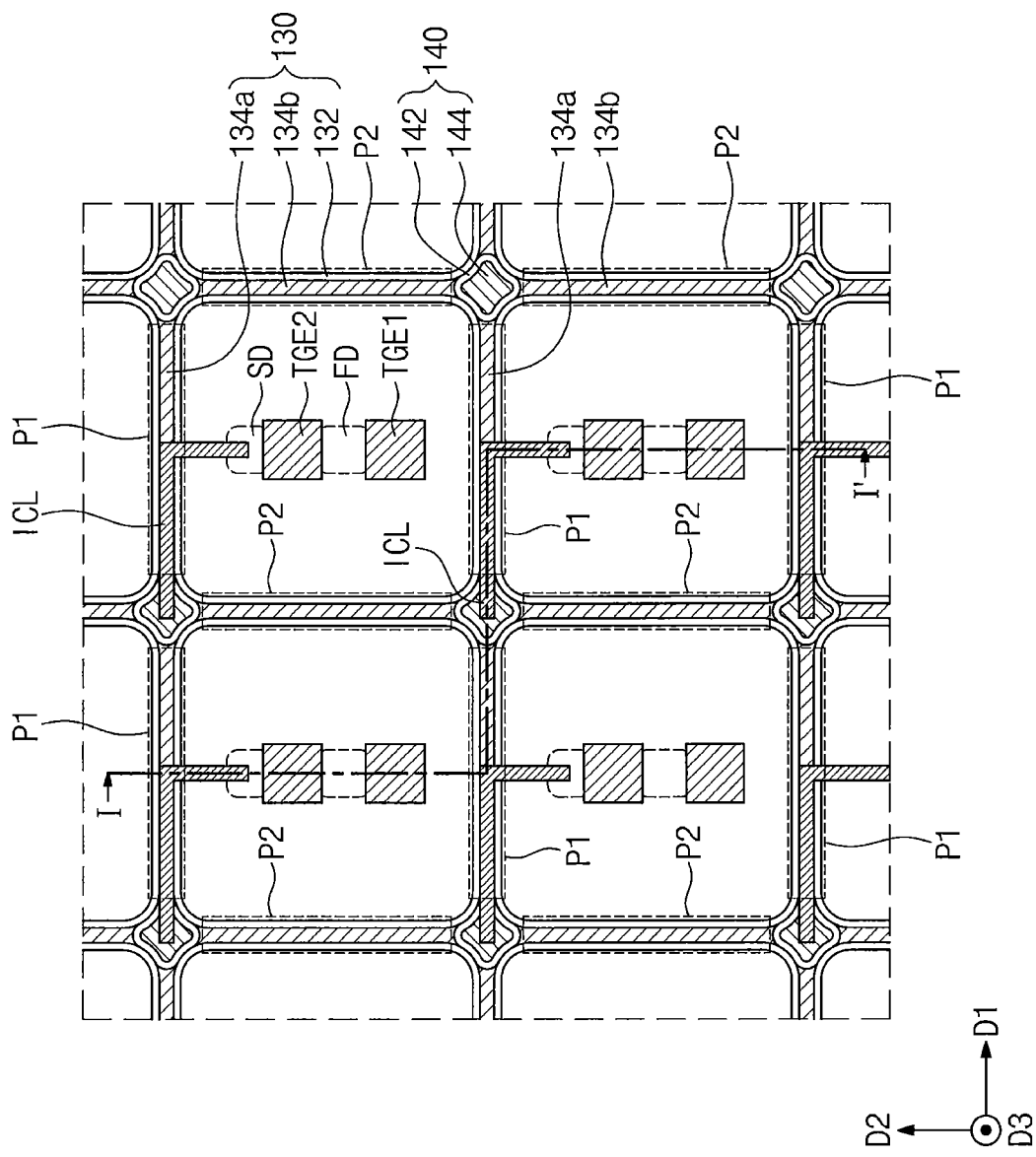
FIG. 7 illustrates a plan view showing an image sensor according to some example embodiments inventive concepts.
Figure 8:
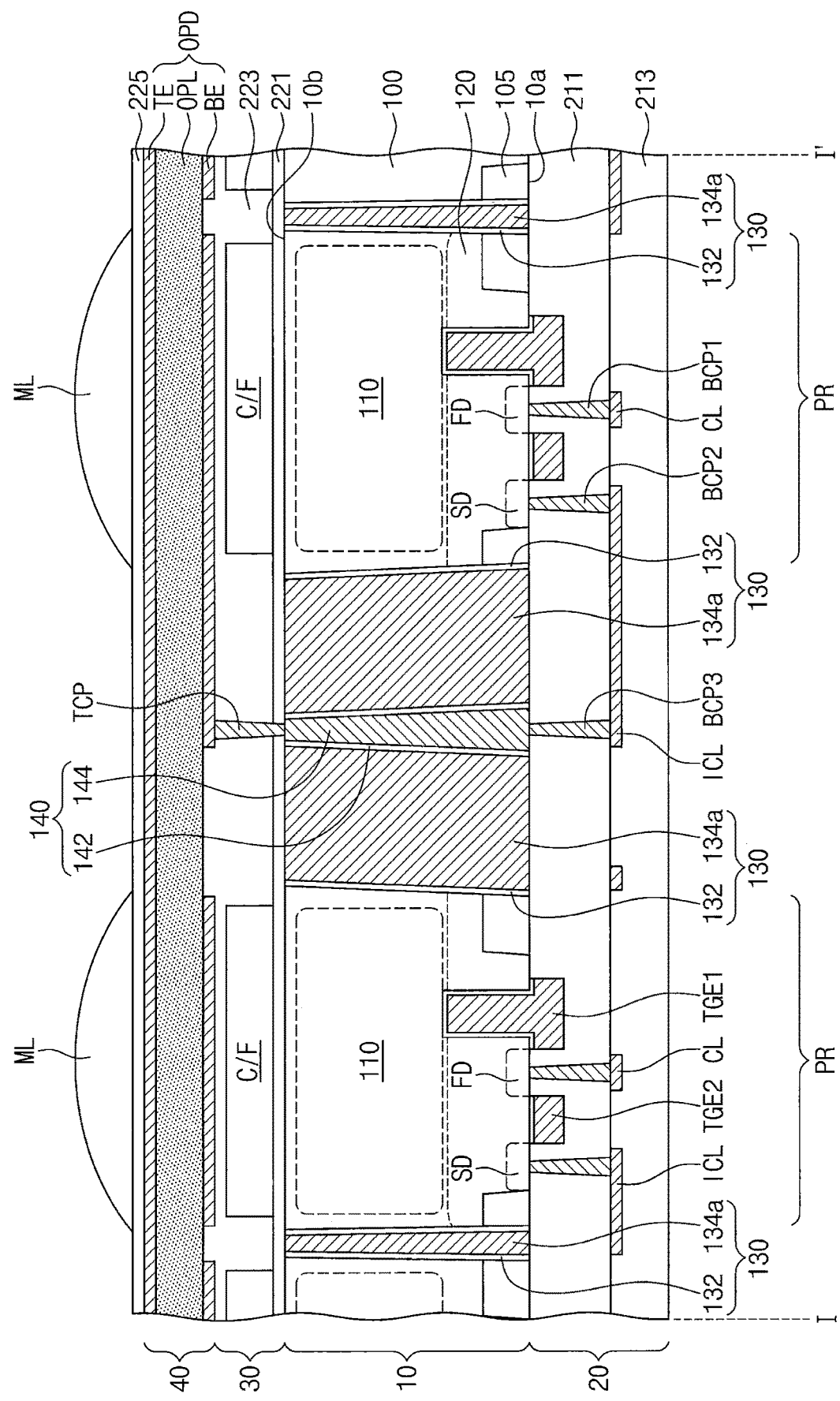
FIG. 8 illustrates a cross-sectional view taken along line I-I' of FIG. 7, showing an image sensor according to some example embodiments inventive concepts.

FIG. 7 illustrates a plan view showing an image sensor according to some example embodiments inventive concepts. FIG. 8 illustrates a cross-sectional view taken along line I-I' of FIG. 7, showing an image sensor according to some example embodiments inventive concepts. In the embodiments shown in FIGS. 7 and 8, the same reference numerals as those in FIGS. 4, 5A, 5B, and 5C refer to the same components, and detailed descriptions of the same components will be omitted.

Referring to FIGS. 7 and 8, each of the pixel regions PR may be defined by the pixel separation structure 130 and the through electrode structures 140. The pixel separation structure 130 may include the first sidewall dielectric pattern 132 and the separation conductive patterns 134a and 134b. The pixel separation structure 130 may include the first parts P1 extending in the first direction D1 and the second parts P2 extending in the second direction D2.

Each of the through electrode structures 140 may include the second sidewall dielectric pattern 142 and the through conductive plug 144. When viewed in plan, each of the through conductive plugs 144 may be disposed between the first separation conductive patterns 134a adjacent to each other in the first direction D1 and between the second separation conductive patterns 134b adjacent to each other in the second direction D2. The through conductive plug 144 may have a maximum width substantially the same as or less than a width of the pixel separation structure 130. In such cases, each pixel region PR may have an enlarged light-receiving area.

Figure 9:
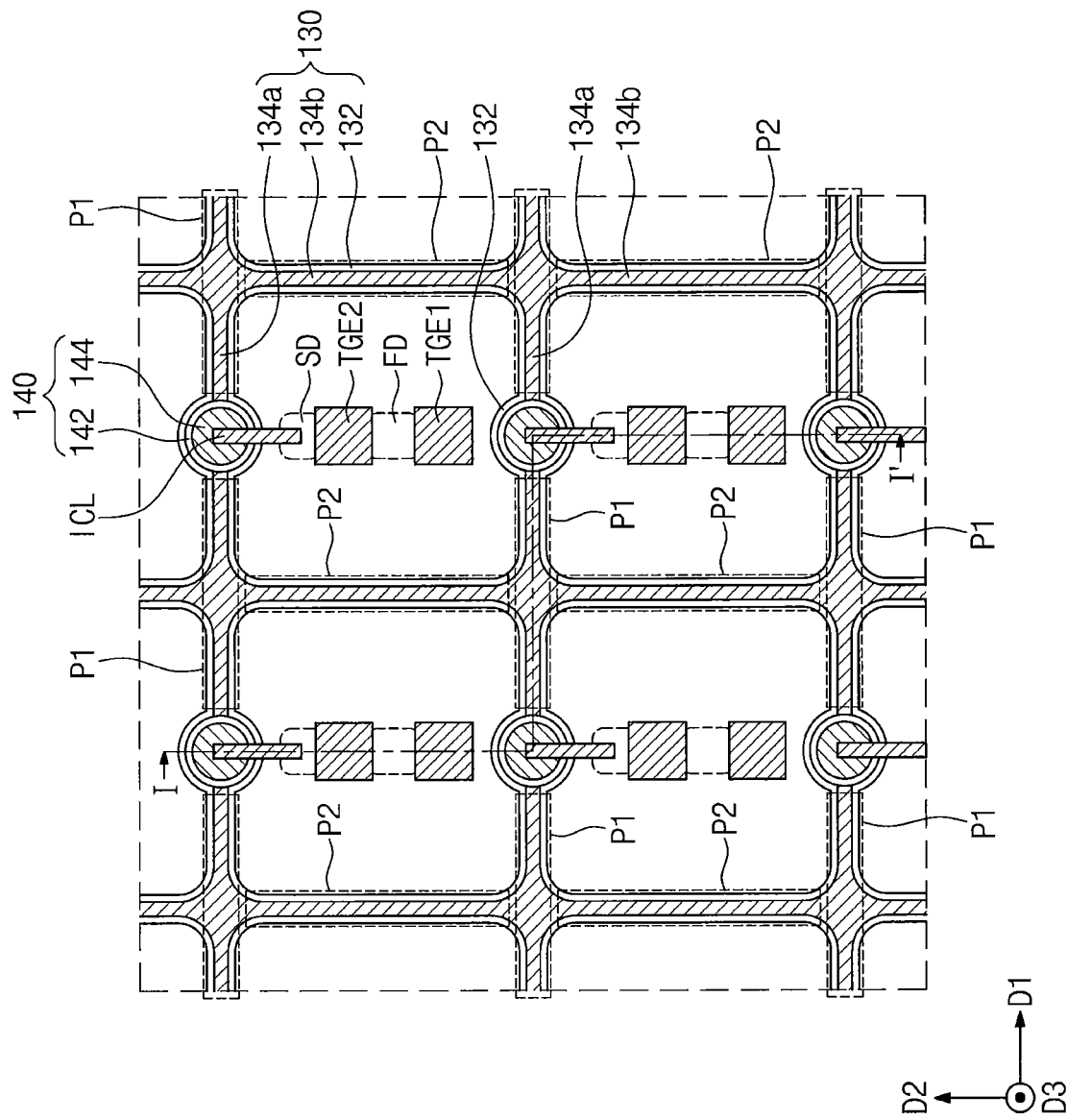
FIG. 9 illustrates a plan view showing an image sensor according to some example embodiments inventive concepts.
Figure 10:
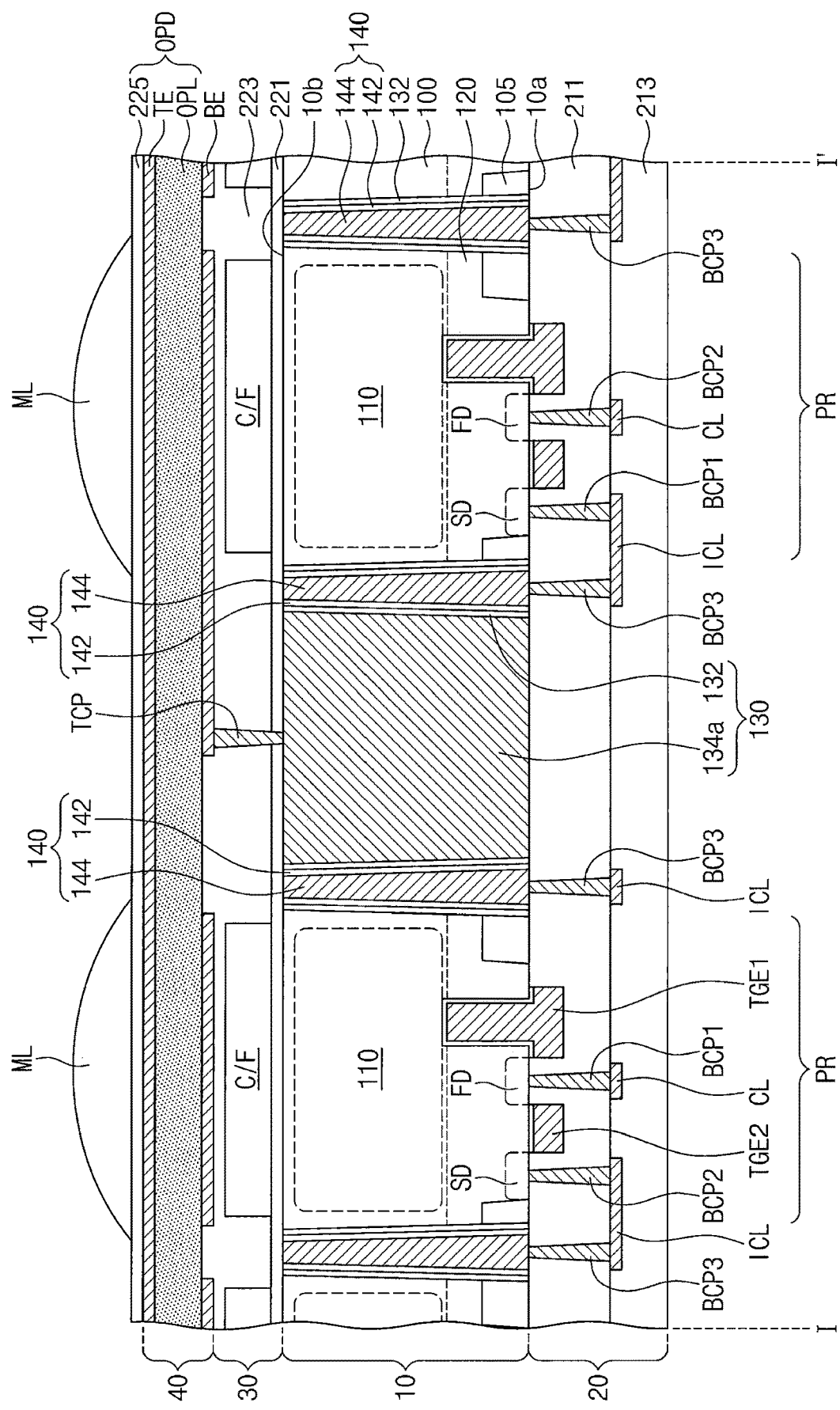
FIG. 10 illustrates a cross-sectional view taken along line I-I' of FIG. 9, showing an image sensor according to some example embodiments inventive concepts.

FIG. 9 illustrates a plan view showing an image sensor according to some example embodiments inventive concepts. FIG. 10 illustrates a cross-sectional view taken along line I-I' of FIG. 9, showing an image sensor according to some example embodiments inventive concepts. In the embodiments shown in FIGS. 9 and 10, the same reference numerals as those in FIGS. 4, 5A, 5B, and 5C refer to the same components, and detailed descriptions of the same components will be omitted.

Referring to FIGS. 9 and 10, each of the pixel regions PR may be defined by the pixel separation structure 130 and the through electrode structures 140. The pixel separation structure 130 may include the first sidewall dielectric pattern 132 and the separation conductive patterns 134a and 134b. The pixel separation structure 130 may include the first parts P1 extending in the first direction D1 and the second parts P2 extending in the second direction D2. For example, the pixel separation structure 130 may be configured such that the first and second parts P1 and P2 are connected to each other. The first separation conductive patterns 134a extending in the first direction D1 may be connected to the second separation conductive patterns 134b extending in the second direction D2.

Each of the through electrode structures 140 may be positioned between two pixel regions PR adjacent to each other in the first direction D1 or the second direction D2. The through electrode structures 140 may penetrate the first parts P1 of the pixel separation structure 130, when viewed in cross-section, and may be connected to the first parts P1, when viewed in plan. Alternatively, the through electrode structures 140 may penetrate the second parts P2 of the pixel separation structure 130, when viewed in cross-section, and may be connected to the second parts P2, when viewed in plan.

Each of the through electrode structures 140 may include the second sidewall dielectric pattern 142 and the through conductive plug 144. The second sidewall dielectric pattern 142 may have portions in contact with the first separation conductive patterns 134a and the first sidewall dielectric pattern 132.

The following will now describes a method of fabricating an image sensor according to some example embodiments inventive concepts.

FIGS. 11A to 17A illustrate plan views showing a method of fabricating an image sensor according to some example embodiments inventive concepts. FIGS. 11B to 17B illustrate cross-sectional views taken along line I-I' of FIGS. 11A to 17A, respectively, showing a method of fabricating an image sensor according to some example embodiments inventive concepts.

Figure 18:
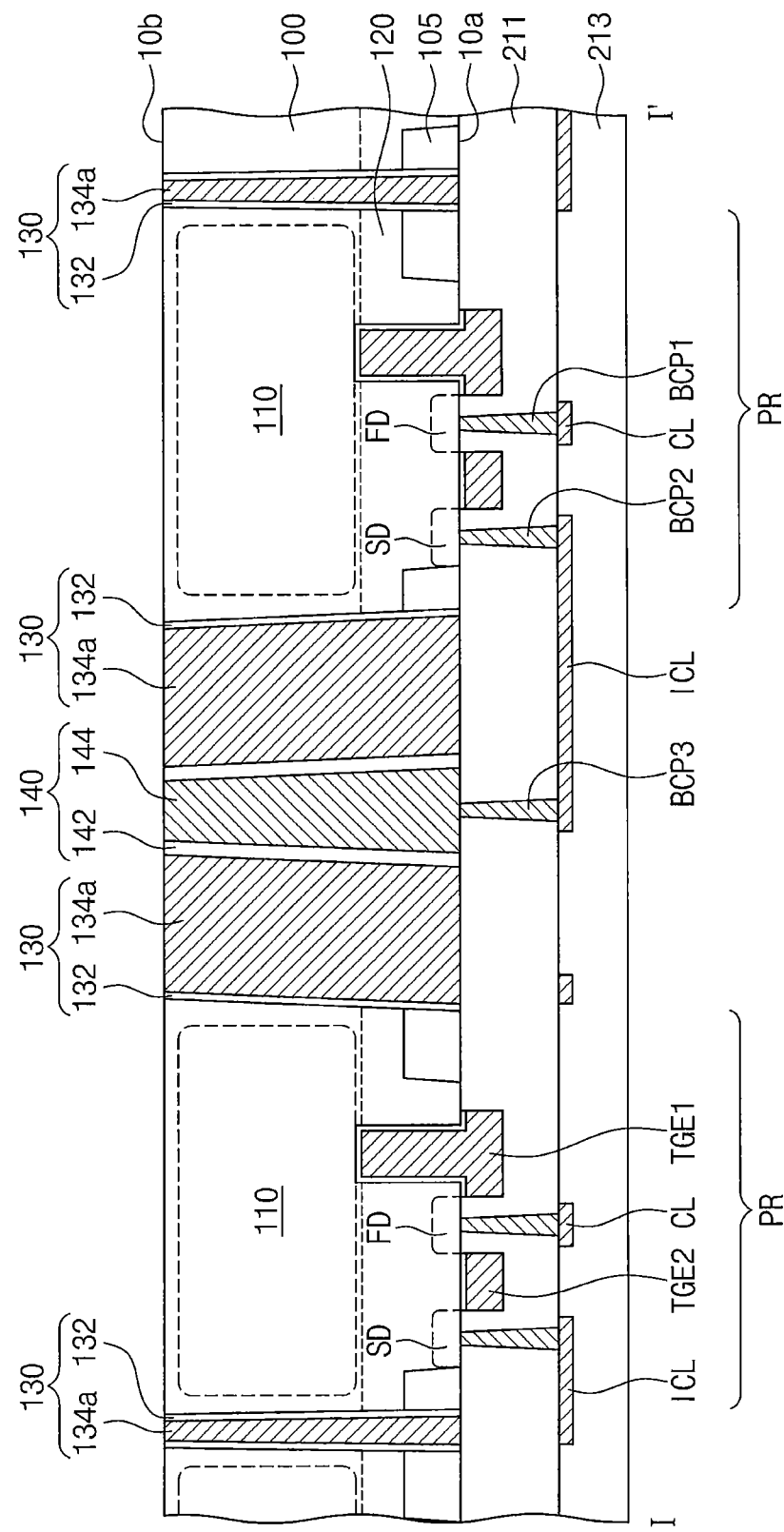
FIGS. 18 and 19 illustrate cross-sectional views showing a method of fabricating an image sensor according to some example embodiments inventive concepts.
Figure 19:
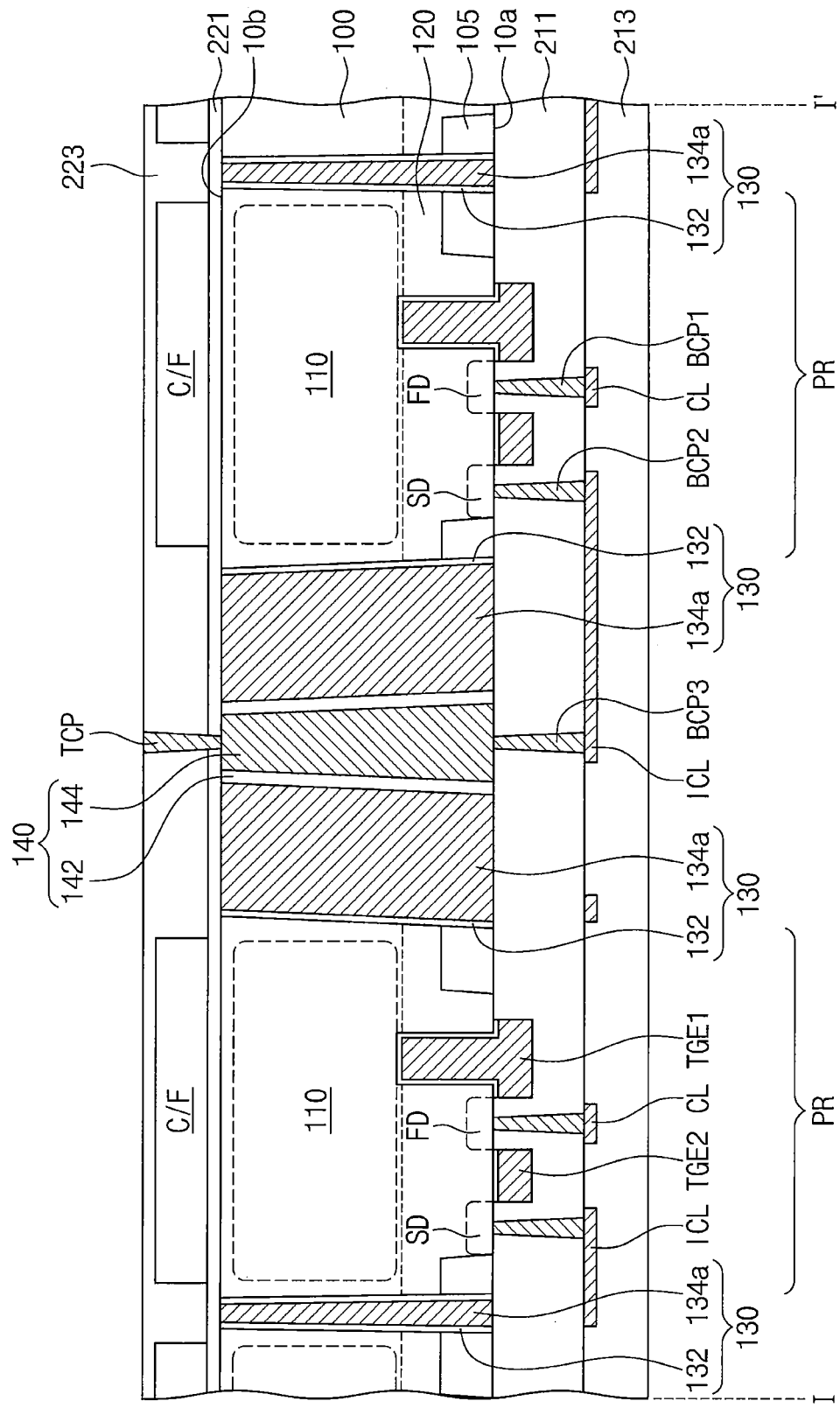

FIGS. 11C to 16C and 11D to 16D illustrate plan views showing a method of fabricating an image sensor according to some example embodiments inventive concepts. FIGS. 18 and 19 illustrate cross-sectional views showing a method of fabricating an image sensor according to some example embodiments inventive concepts.

Figure 11A:
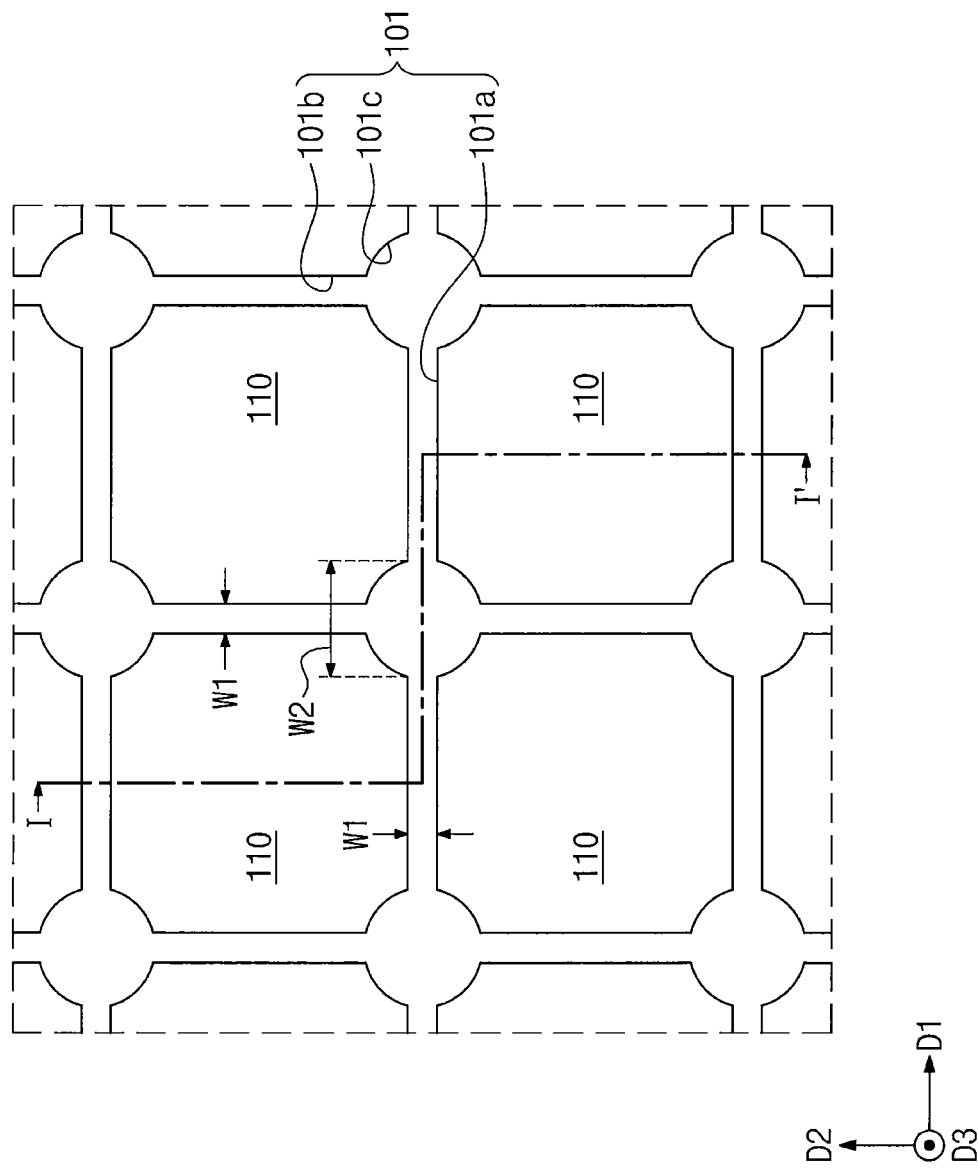
Figure 11B:
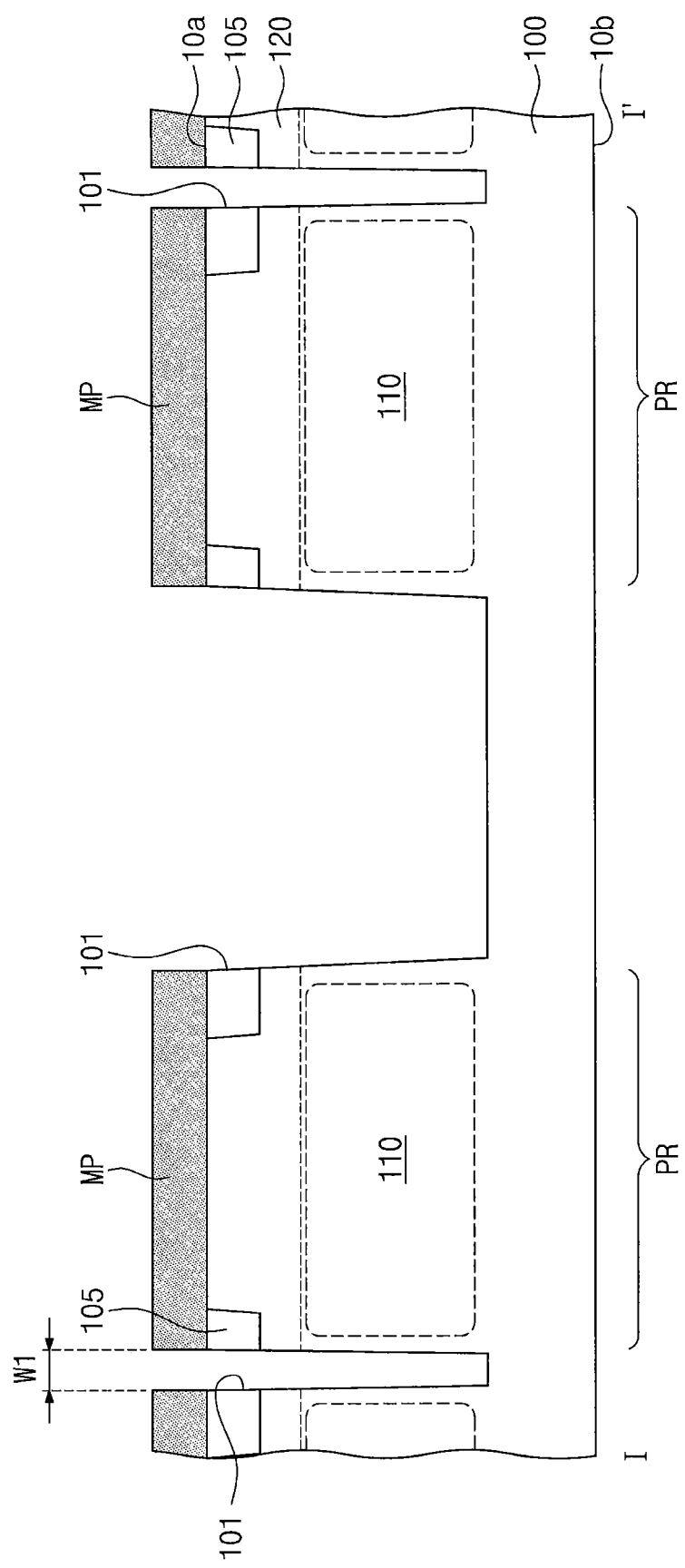

Referring to FIGS. 11A and 11B, a semiconductor substrate 100 may be provided to have a first conductivity (e.g., p-type). The semiconductor substrate 100 may have a first surface 10a and a second surface 10b opposite each other. The semiconductor substrate 100 may be or include an epitaxial layer on a bulk silicon substrate having the first conductivity the same as that of the epitaxial layer, or a bulk semiconductor substrate including a well region having the first conductivity.

Photoelectric conversion regions 110 and well impurity regions 120 may be formed in the semiconductor substrate 100. The formation of the photoelectric conversion regions 110 may include forming on the first surface 10a of the semiconductor substrate 100 a mask (not shown) having openings that correspond to pixel regions PR which will be discussed below, and using the mask to dope the semiconductor substrate 100 with impurities having a second conductivity (e.g., n-type) different from the first conductivity. The formation of the well impurity regions 120 may include using the mask to dope the semiconductor substrate 100 with impurities having the first conductivity. The mask may be removed after the formation of the photoelectric conversion regions 110 and the well impurity regions 120. The photoelectric conversion regions 110 may be formed at deep positions from the first surface 10a of the semiconductor substrate 100, and the well impurity regions 120 may be formed at shallow positions from the first surface 10a of the semiconductor substrate 100.

A device isolation layer 105 may be formed in the well impurity region 120 of each pixel region PR, defining an active section. The formation of the device isolation layer 105 may include forming a shallow trench by patterning the first surface 10a of the semiconductor substrate 100, and then filling the shallow trench with an insulating material. The device isolation layer 105 may be adjacent to the first surface 10a of the semiconductor substrate 100, and may have a bottom surface positioned in the well impurity region 120.

Before or after the photoelectric conversion regions 110 are formed, a deep trench 101 may be formed to define a plurality of pixel regions PR on the semiconductor substrate 100. The deep trench 101 may be formed by patterning the first surface 10a of the semiconductor substrate 100. The plurality of pixel regions PR may be arranged in a matrix shape along first and second directions D1 and D2 intersecting each other.

For example, the formation of the deep trench 101 may include forming a mask pattern MP on the first surface 10a of the semiconductor substrate 100, and performing an anisotropic etching process in which the mask pattern MP is used as an etching mask to anisotropically etch the semiconductor substrate 100. The mask pattern MP may include a silicon nitride layer or a silicon oxynitride layer.

The deep trench 101 may extend from the first surface 10*a* toward the second surface 10*b* of the semiconductor substrate 100, exposing a sidewall of the semiconductor substrate 100. Because the anisotropic etching process is performed to form the deep trench 101, the deep trench 101 may have a width that gradually decreases as approaching the second surface 10*b* from the first surface 10*a* of the semiconductor substrate 100. For example, the deep trench 101 may have an inclined sidewall.

In some example embodiments, the deep trench 101 may include first regions 101*a* extending in the first direction D1, second regions 101*b* extending in the second direction D2 and intersecting the first regions 101*a*, and connection regions 101*c* connected to the first and second regions 101*a* and 101*b*. The deep trench 101 may have a first width W1 on the first and second regions 101*a* and 101*b*, and also have a second width W2 on the connection regions 101*c*.

Figure 11C:
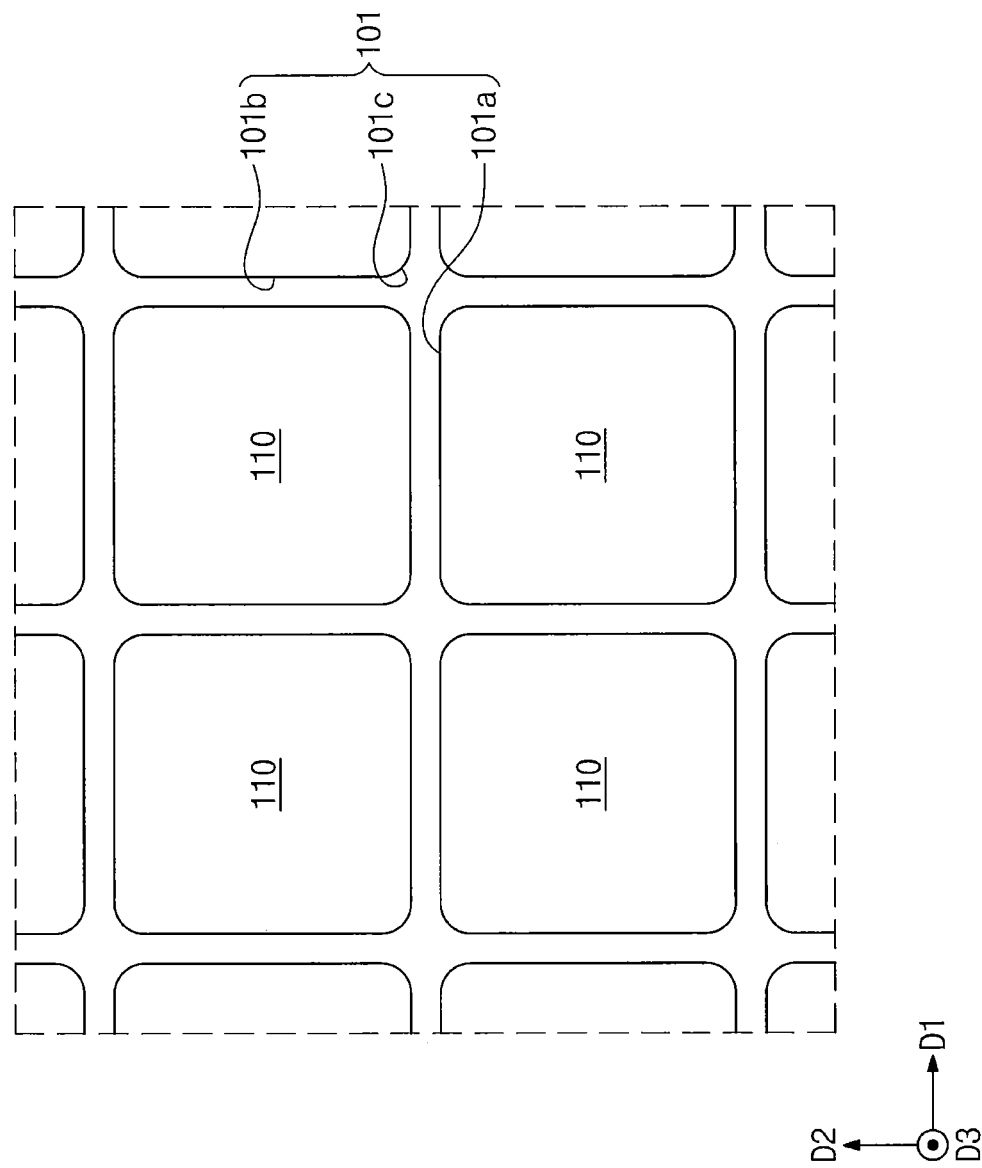
Figure 11D:
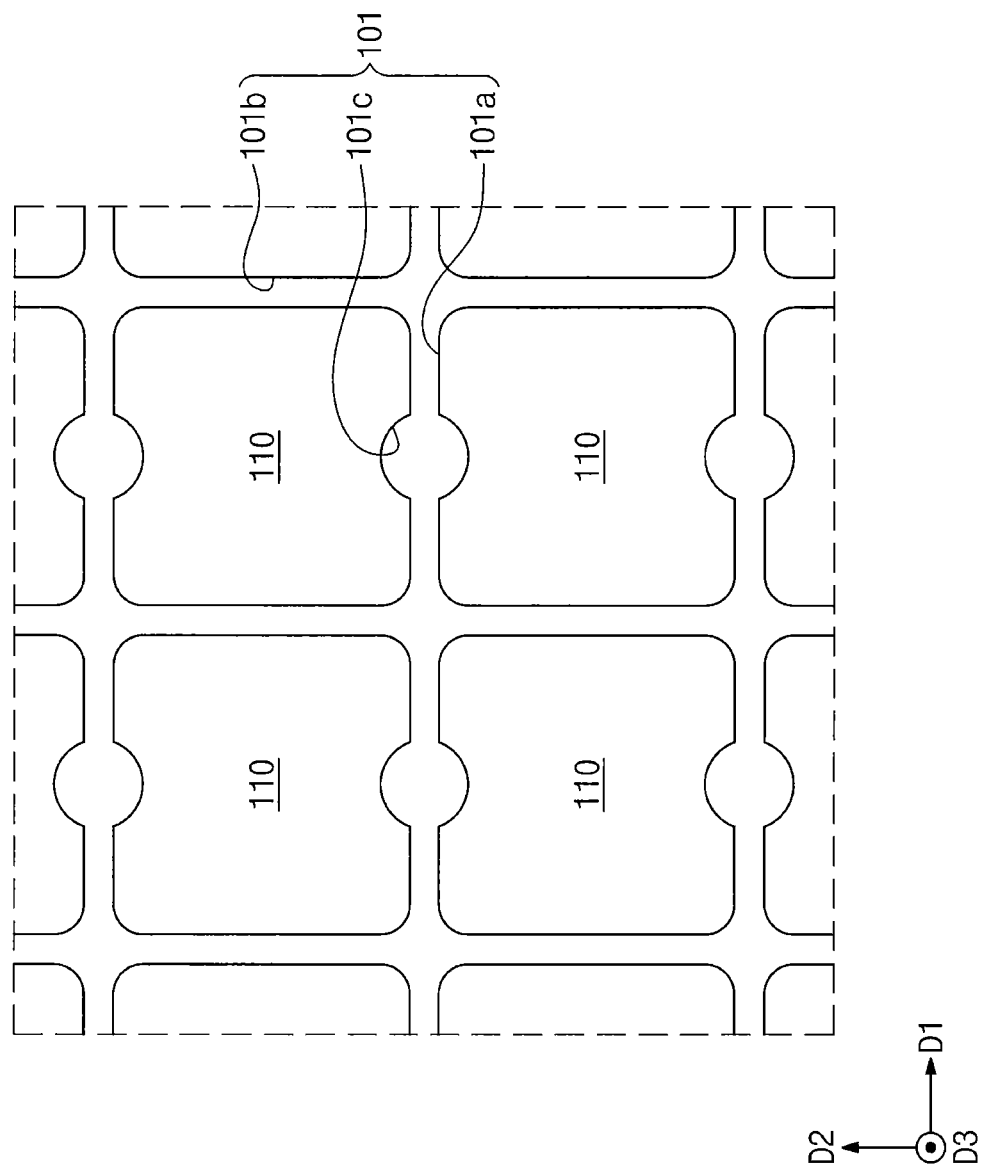
Figure 12A:
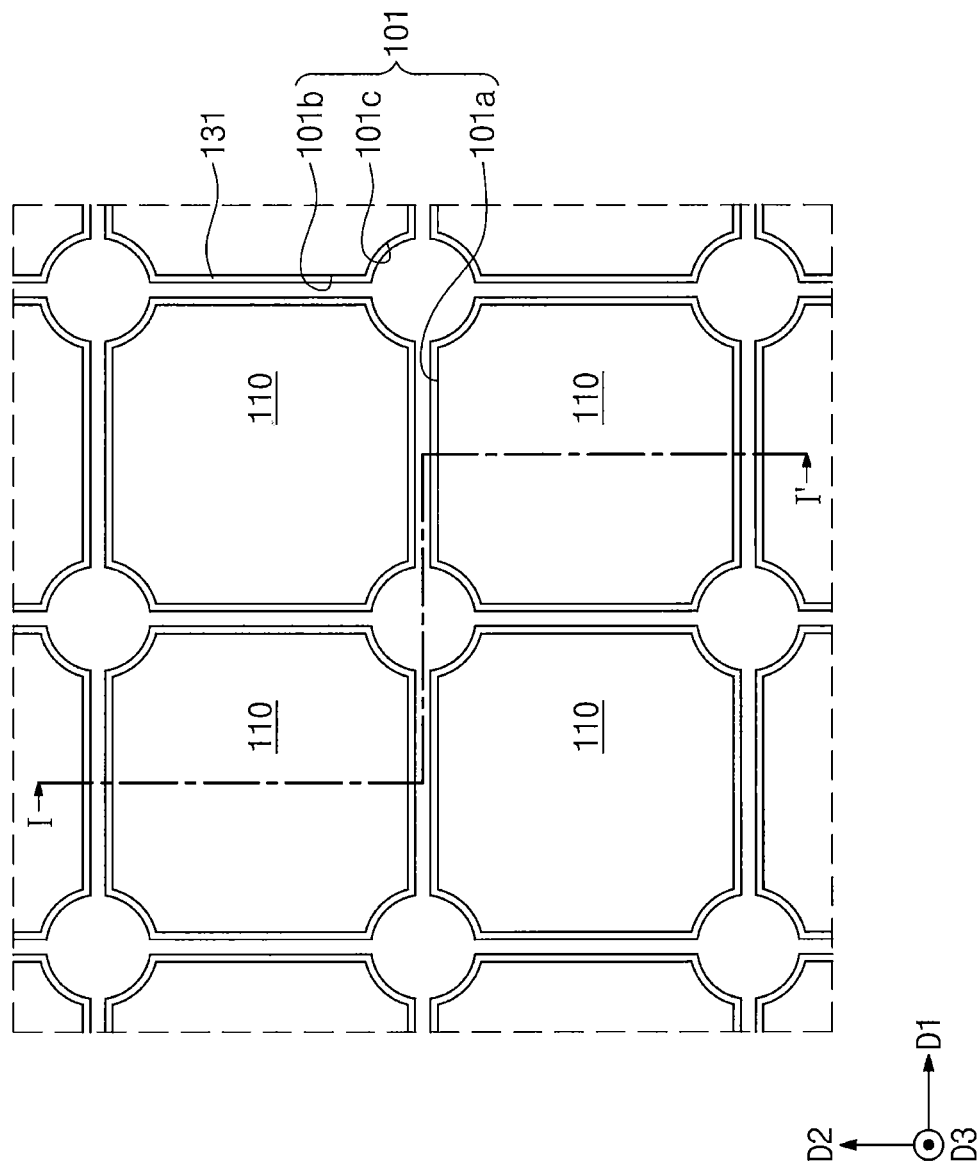
Figure 12B:
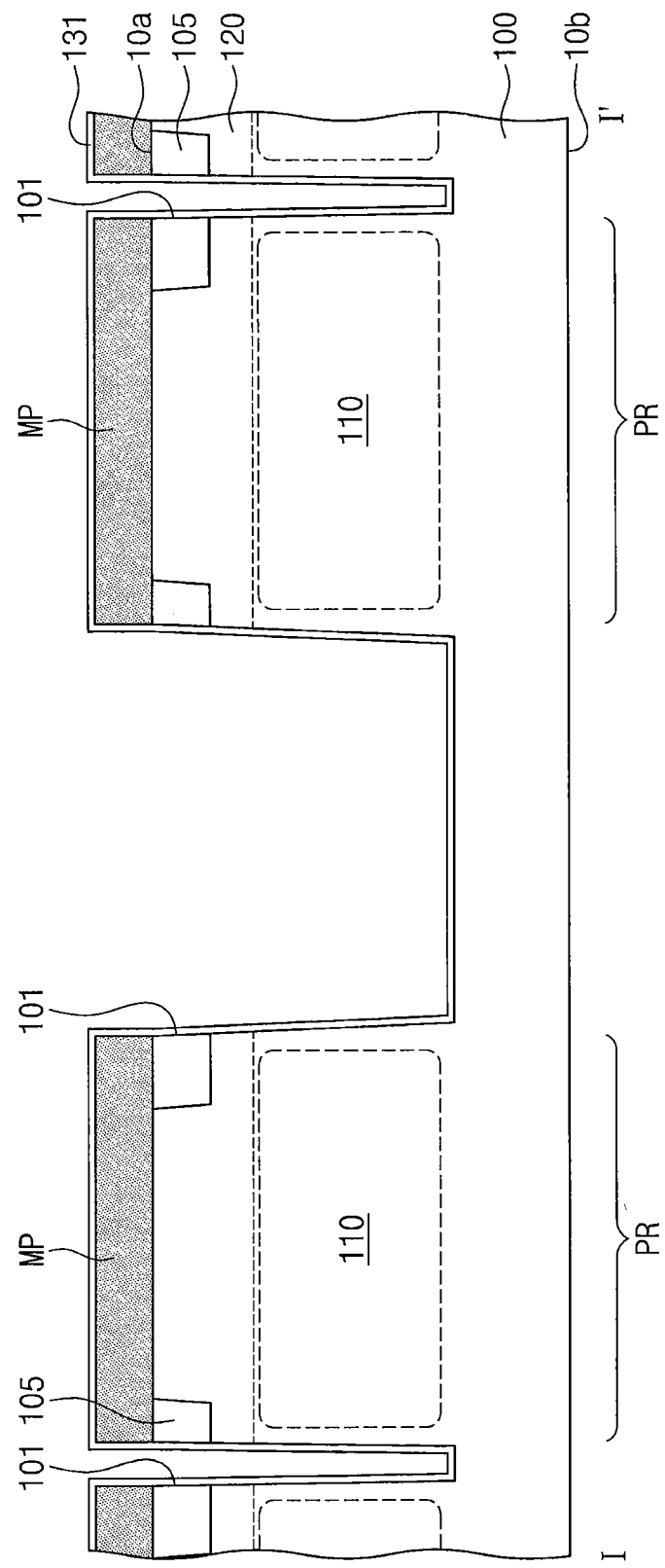
Figure 12D:
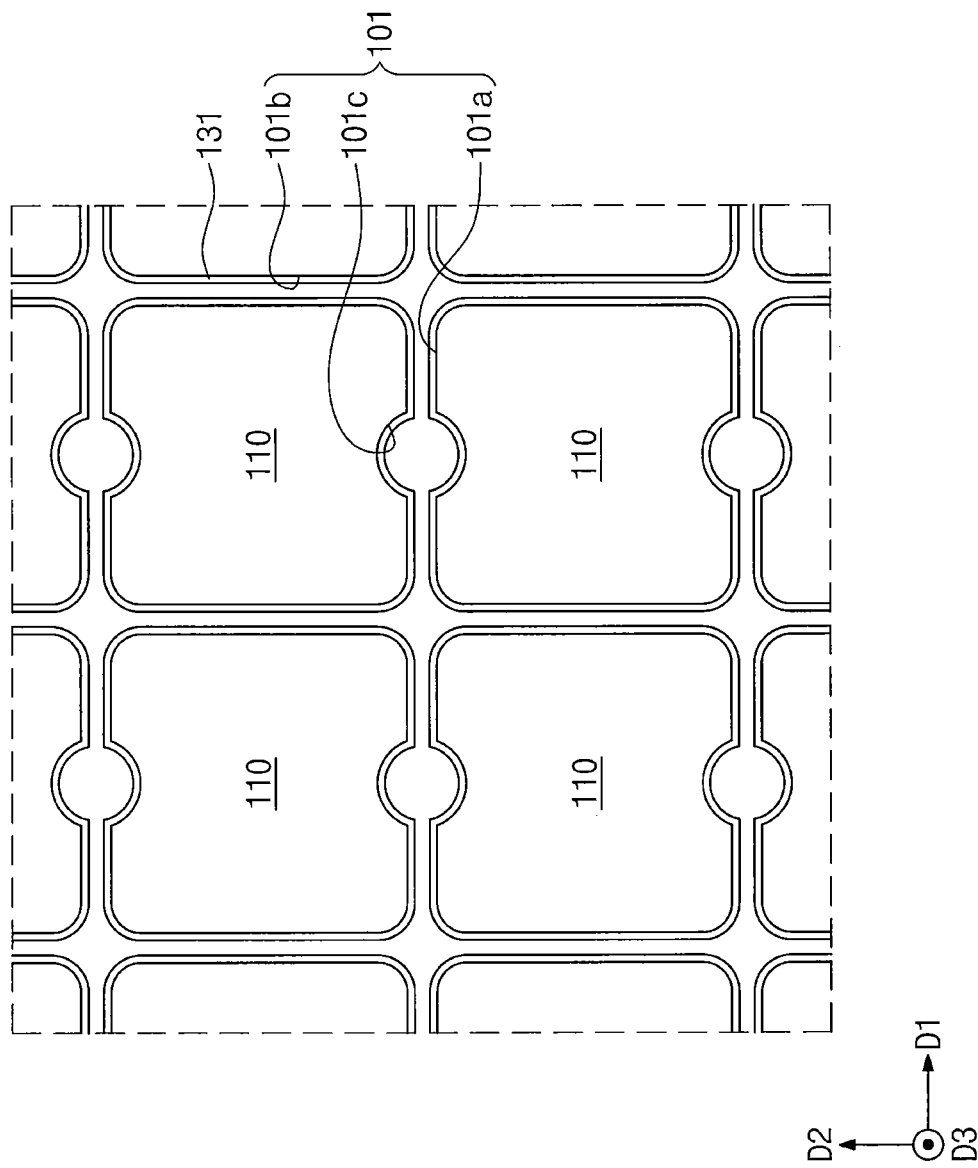
Figure 13A:
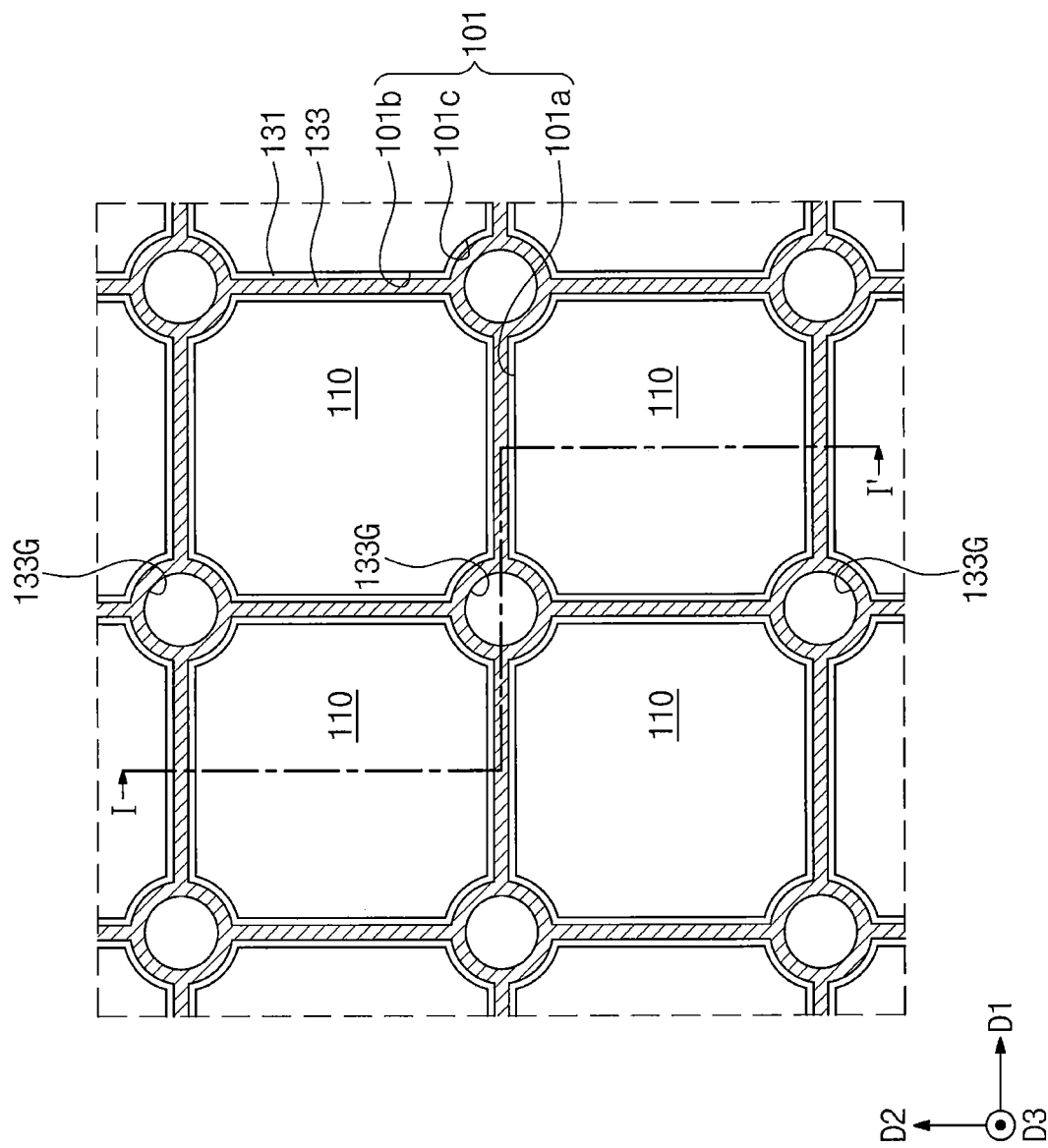
Figure 13B:
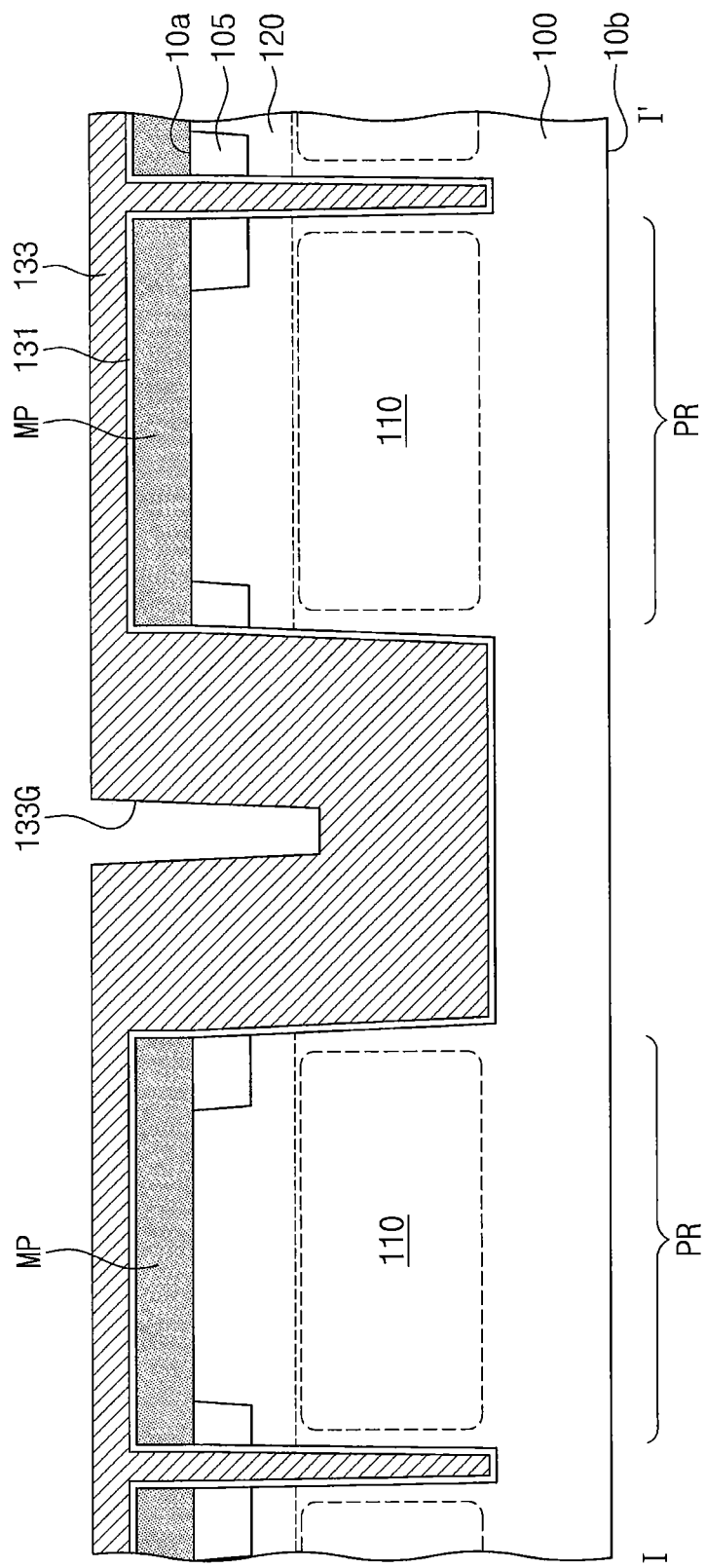
Figure 13C:
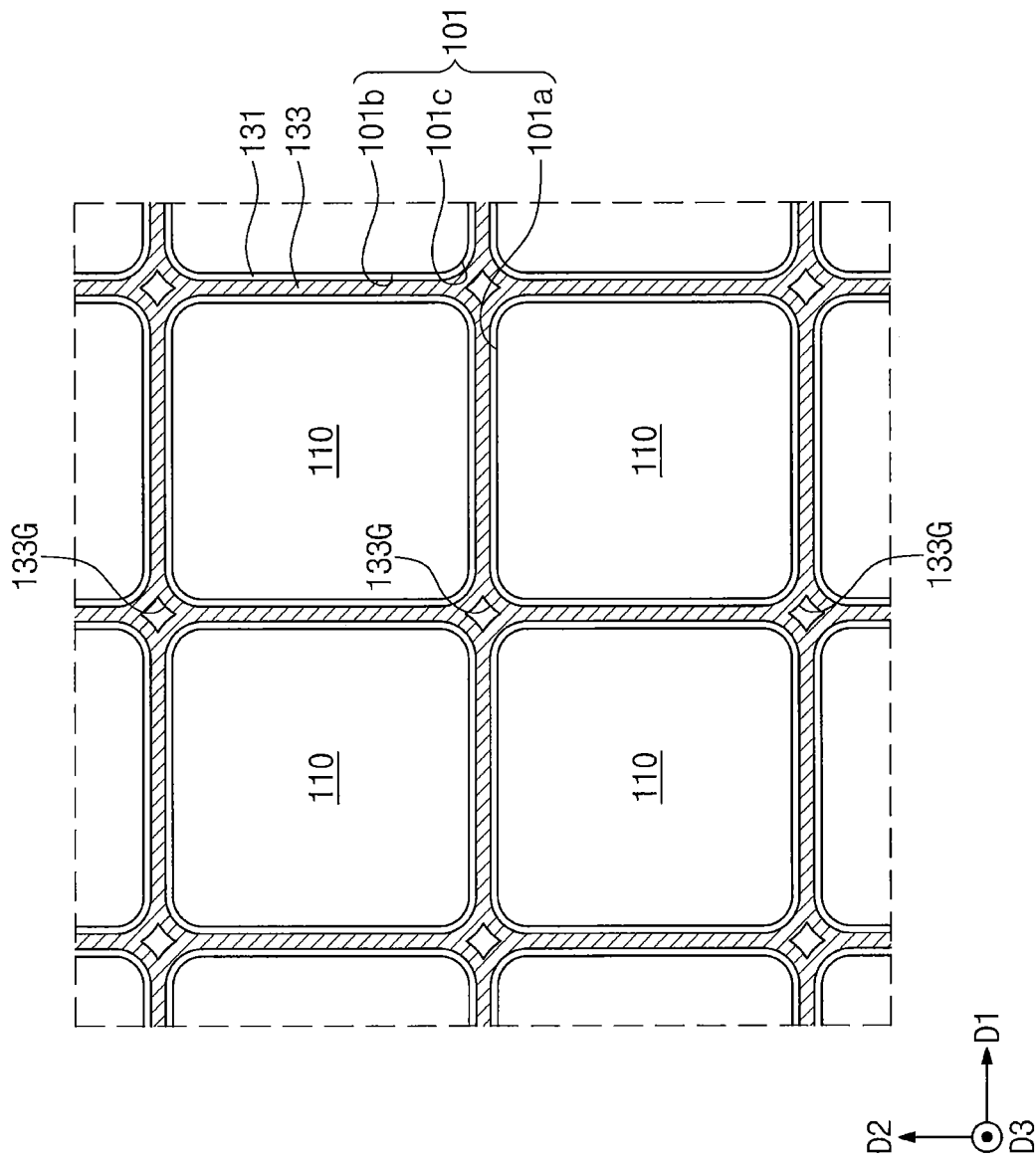
Figure 13D:
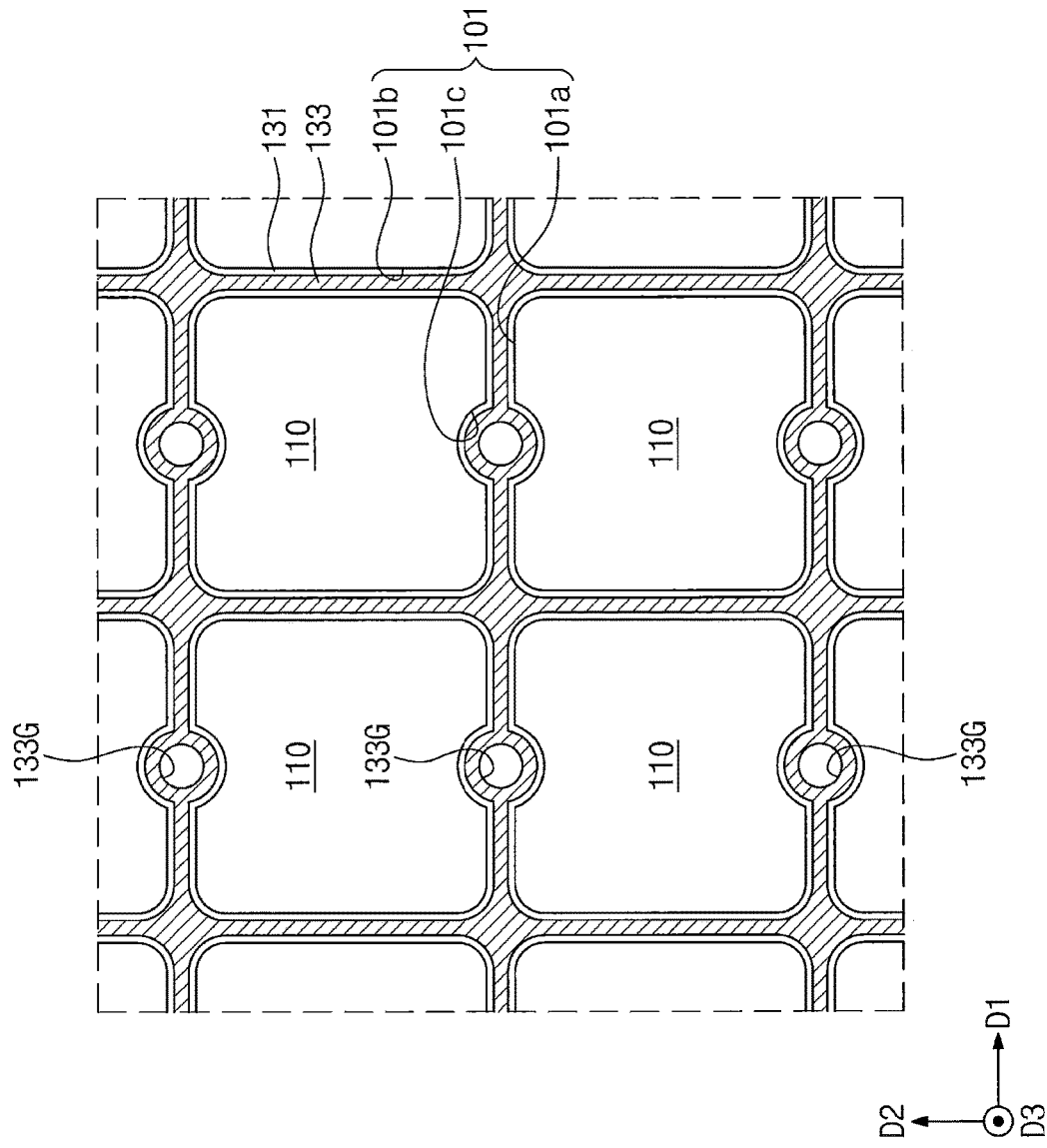

According to the embodiments shown in FIGS. 11A and 11C, each of the connection regions 101*c* may be positioned between four pixel regions PR adjacent to each other. According to the embodiments shown in FIG. 11D, each of the connection regions 101*c* may be positioned between two pixel regions PR adjacent to each other. For example, each of the connection regions 101*c* may be spaced apart from the second regions 101*b* and connected to the first regions 101*a*. For another example, each of the connection regions 101*c* may be spaced apart from the first regions 101*a* and connected to the second regions 101*b*.

Referring to FIGS. 12A, 12B, 12C, and 12D, a first sidewall dielectric layer 131 may be formed to conformally cover an inner wall of the deep trench 101. The formation of the first sidewall dielectric layer 131 may include depositing an insulating material to have a uniform thickness on an entire surface of the semiconductor substrate 100 in which the deep trench 101 is formed. The first sidewall dielectric layer 131 may include, for example, one or more of silicon oxide, silicon nitride, and silicon oxynitride.

Referring to FIGS. 13A, 13B, 13C, and 13D, a separation conductive layer 133 may be formed in the deep trench 101 in which the first sidewall dielectric layer 131 is formed. The separation conductive layer 133 may include a polysilicon layer doped with no impurities, a polysilicon layer doped with impurities having the first conductivity, or a metal layer.

The separation conductive layer 133 may be formed using a deposition process, and may completely fill the first and second regions 101*a* and 101*b* of the deep trench 101. Because the deposition process is performed to form the separation conductive layer 133, the separation conductive layer 133 may partially fill the connection regions 101*c* and may have gaps 133G on the connection regions 101*c*.

Referring to FIGS. 14A, 14B, 14C, and 14D, an isotropic etching process may be performed on the separation conductive layer 133, forming separation conductive patterns 134*a* and 134*b*. The isotropic etching process on the separation conductive layer 133 may include wet-etching the separation conductive layer 133 by providing a wet etchant to the gaps 133G formed on the separation conductive layer 133. When the separation conductive layer 133 includes a polysilicon layer, the separation conductive layer 133 may be wet-etched using a mixture of hydrofluoric acid (HF), nitric acid ($HNO_3$), and acetic acid ($CH_3COOH$).

The isotropic etching process on the separation conductive layer 133 may partially remove the separation conductive layer 133 from the connection regions 101*c*, which may result in the formation of the separation conductive patterns 134*a* and 134*b*. When the isotropic etching process is performed on the separation conductive layer 133, the first sidewall dielectric layer 131 may serve as an etch stop layer. For example, the formation of the separation conductive patterns 134*a* and 134*b* may partially expose the first sidewall dielectric layer 131 on the connection regions 101*c*.

The separation conductive patterns 134*a* and 134*b* may include first separation conductive patterns 134*a* formed in the first regions 101*a* of the deep trench 101 and second separation conductive patterns 134*b* formed in the second regions 101*b* of the deep trench 101.

Figure 14A:
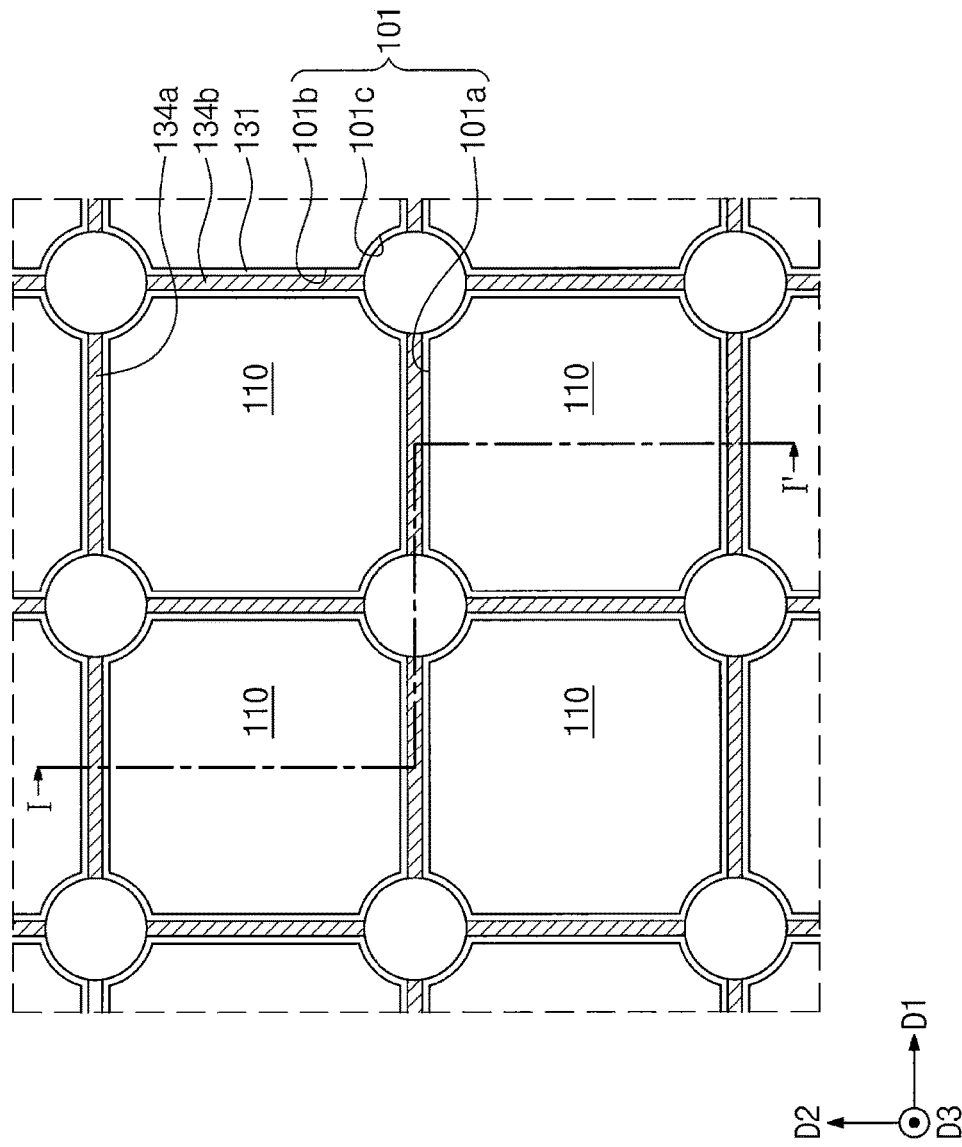
Figure 14B:
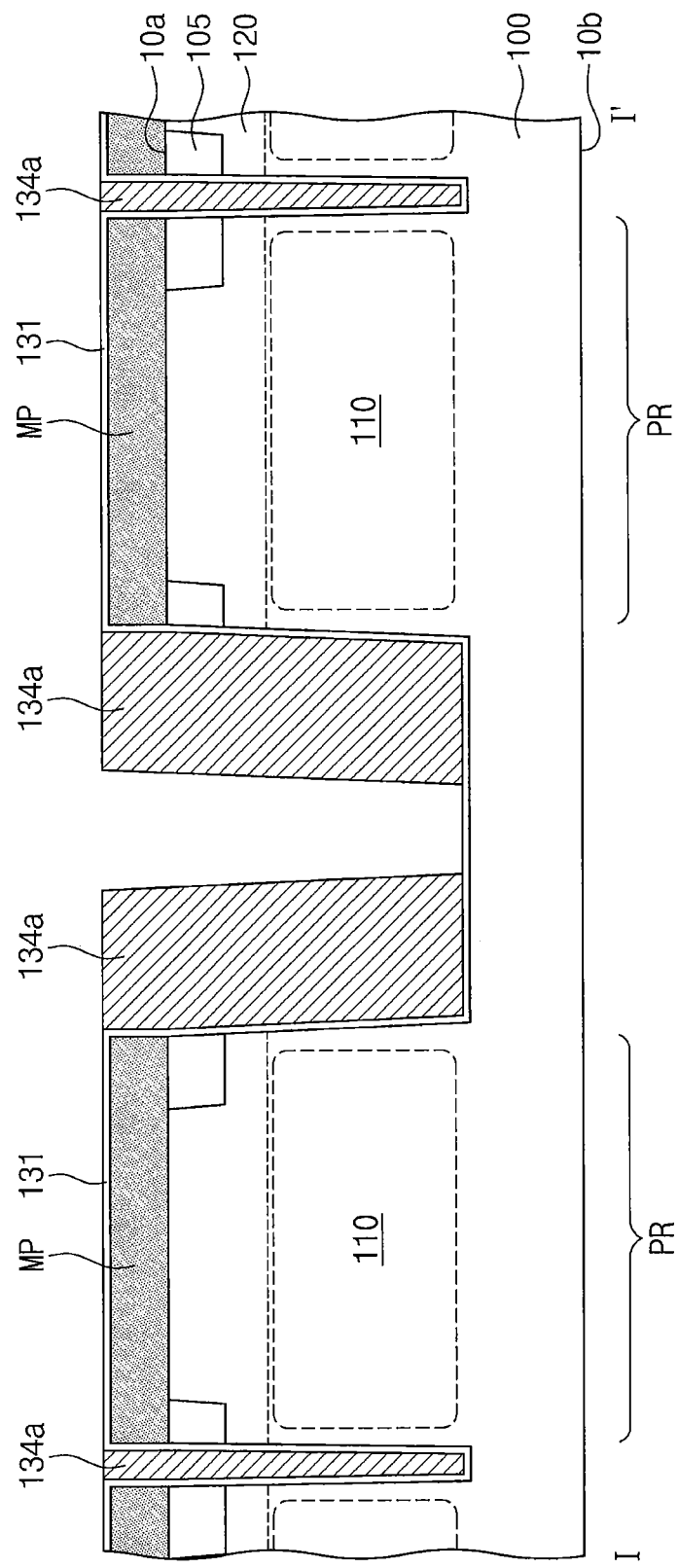
Figure 14C:
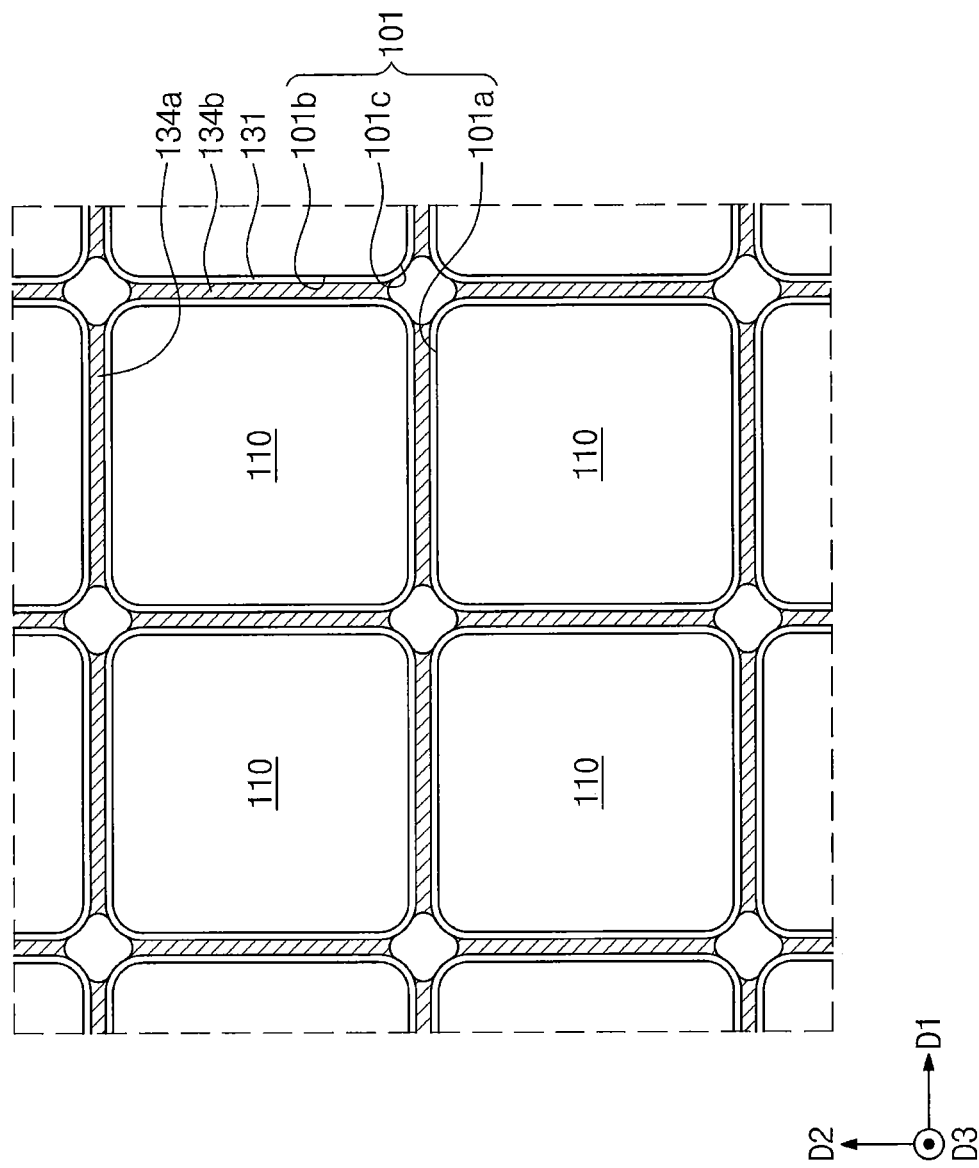
Figure 14D:
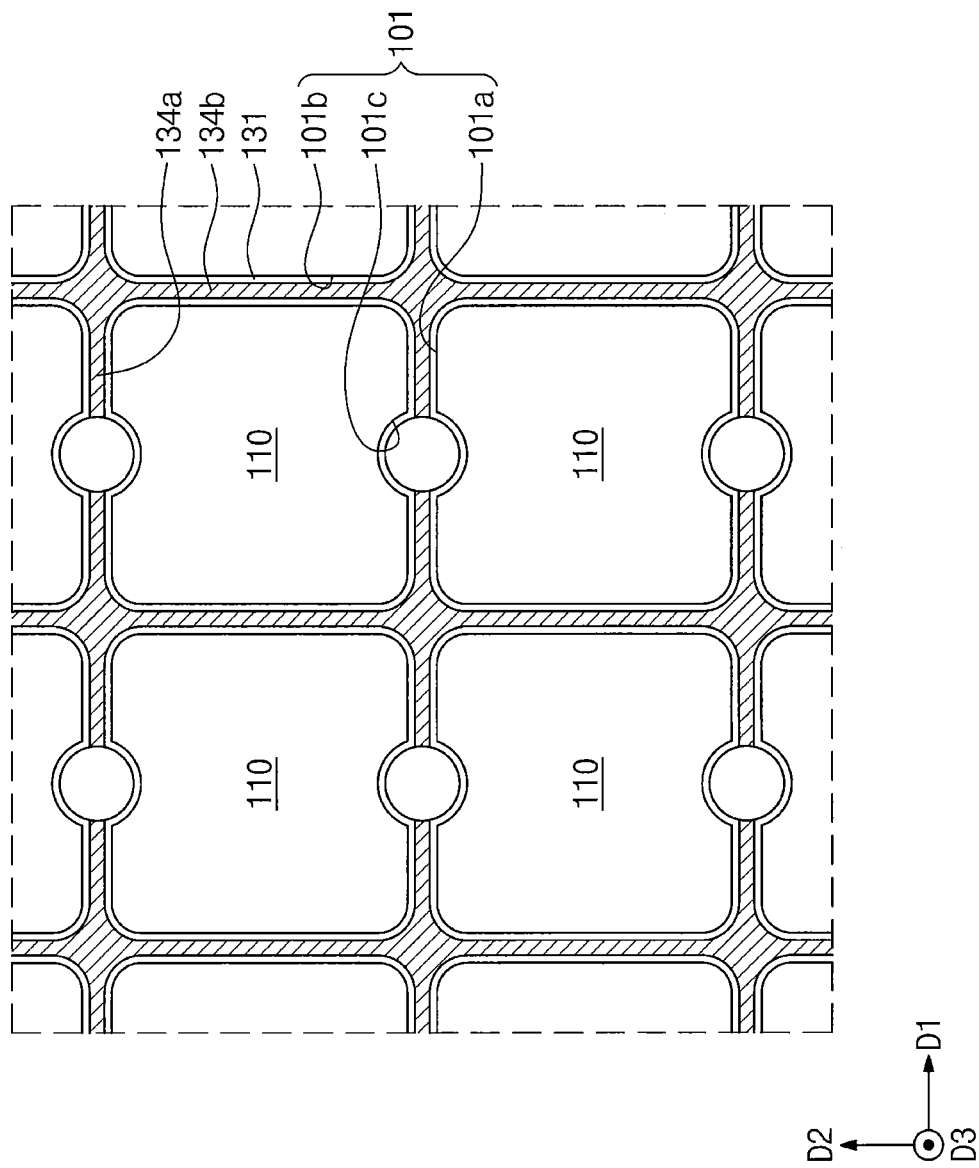

According to the embodiments shown in FIGS. 14A, 14B, and 14C, the first and second separation conductive patterns 134*a* and 134*b* may have sidewalls exposed to the connection regions 101*c*. The first separation conductive patterns 134*a* may be spaced apart from the second separation conductive patterns 134*b*. According to the embodiments shown in FIG. 14D, the sidewalls of the first separation conductive patterns 134*a* may be exposed to the connection regions 101*c*, and the first and second separation conductive patterns 134*a* and 134*b* may be connected to each other.

Referring to FIGS. 15A, 15B, 15C, and 15D, on the connection regions 101*c*, a second sidewall dielectric pattern 142 may be formed to cover the sidewalls of the separation conductive patterns 134*a* and 134*b*.

The formation of the second sidewall dielectric pattern 142 may include depositing a second sidewall dielectric layer to have a uniform thickness in the deep trench 101 in which the separation conductive patterns 134*a* and 134*b* are formed, and then performing an isotropic etching process or an etch-back process on the second sidewall dielectric layer. The second sidewall dielectric pattern 142 may include, for example, one or more of silicon oxide, silicon nitride, and silicon oxynitride.

The second sidewall dielectric pattern 142 may be in direct contact with the first and second separation conductive patterns 134*a* and 134*b* and with the first sidewall dielectric layer 131. The second sidewall dielectric pattern 142 may define through regions 142T that partially expose the semiconductor substrate 100 on the connection regions 101*c*. Each of the through regions 142T may have a diameter that varies depending on a thickness of the second sidewall dielectric pattern 142.

Figure 15A:
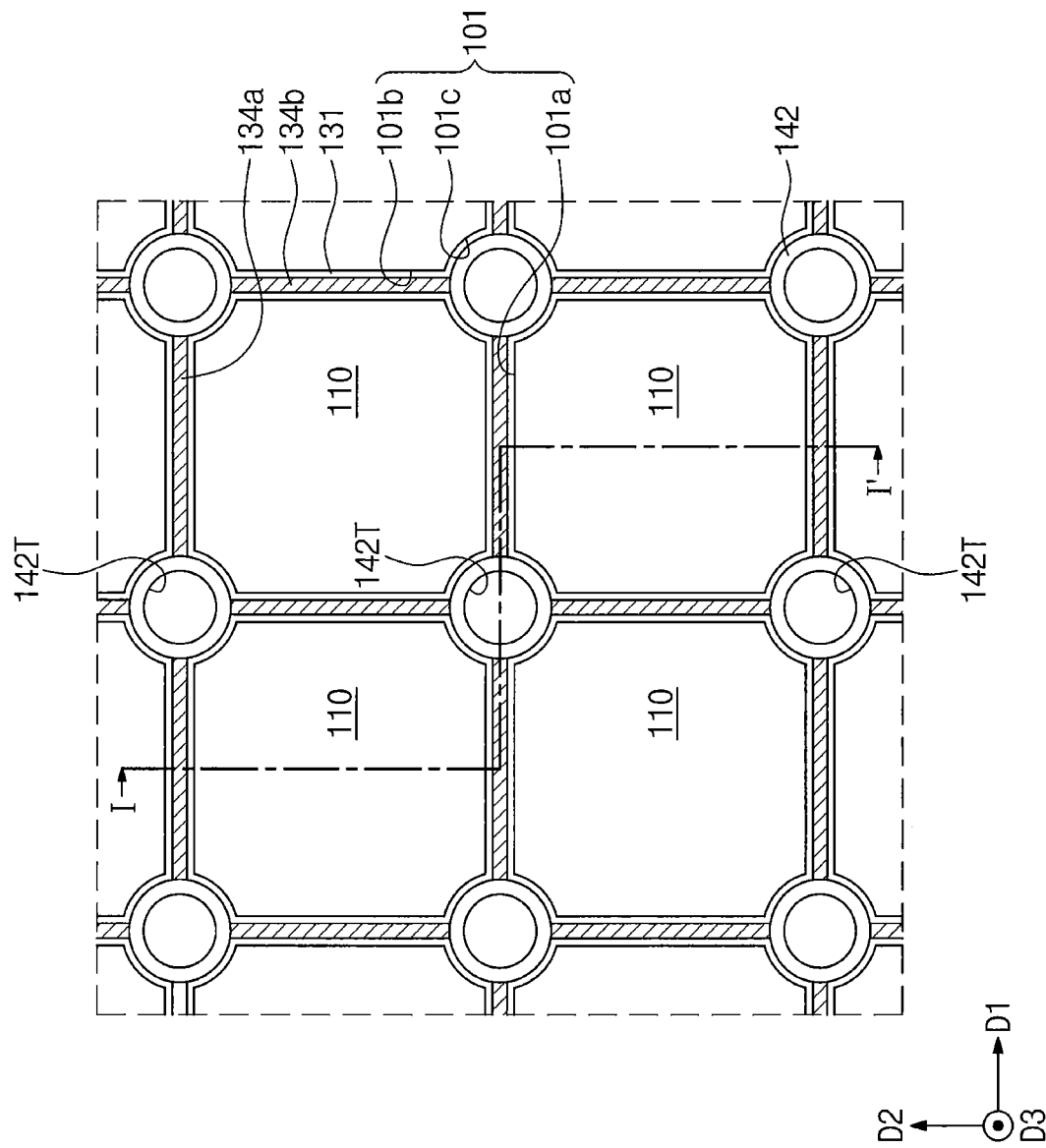
Figure 15B:
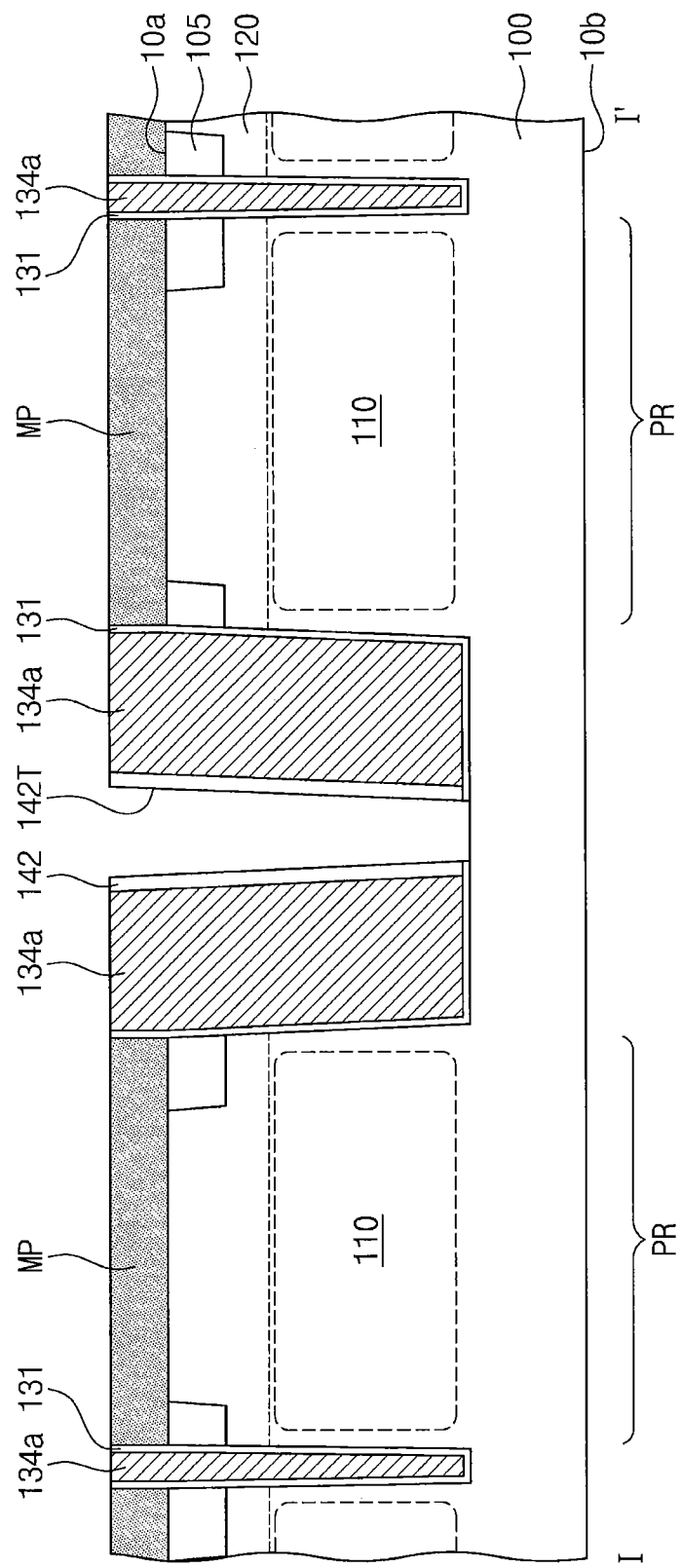
Figure 15C:
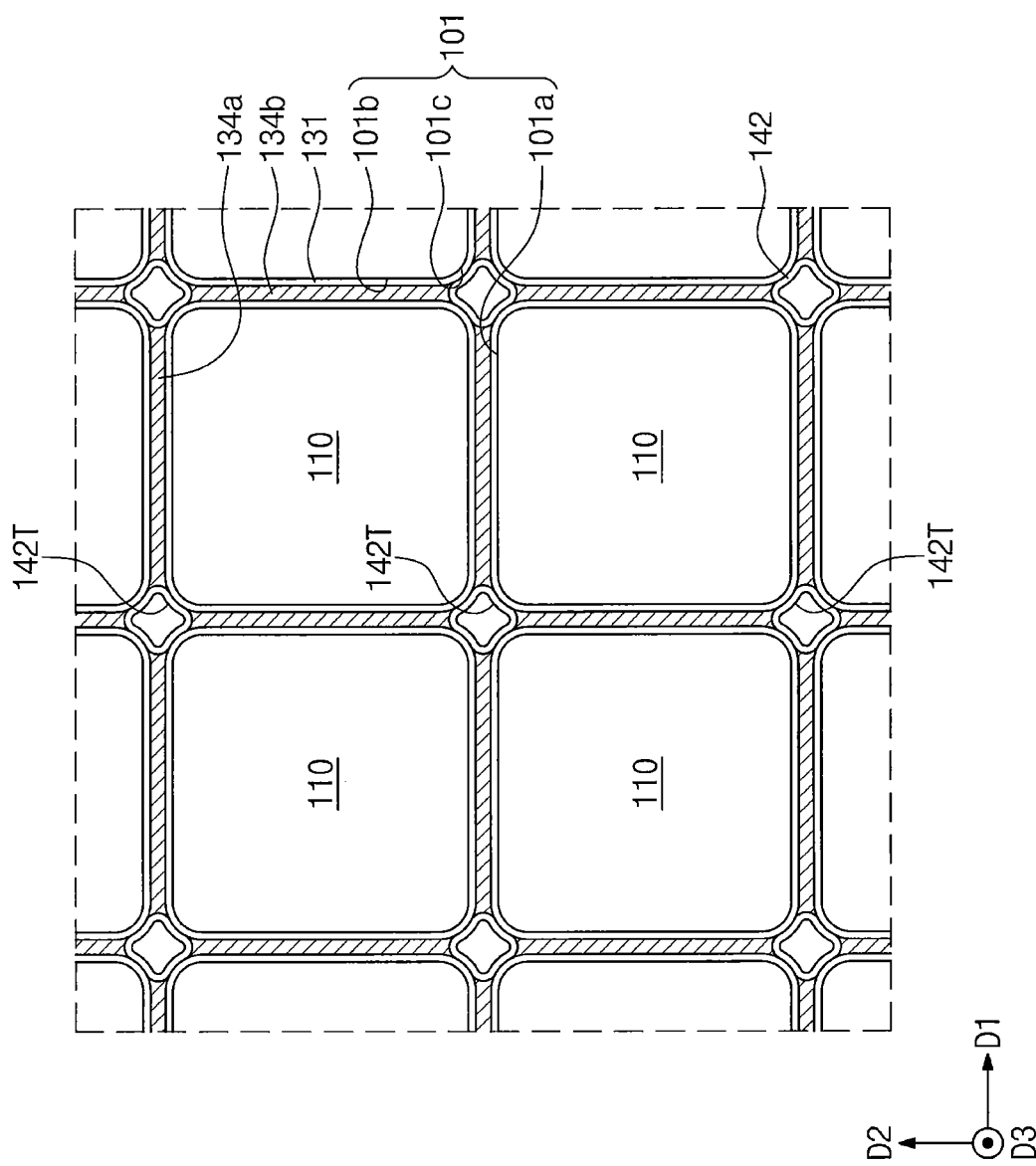
Figure 15D:
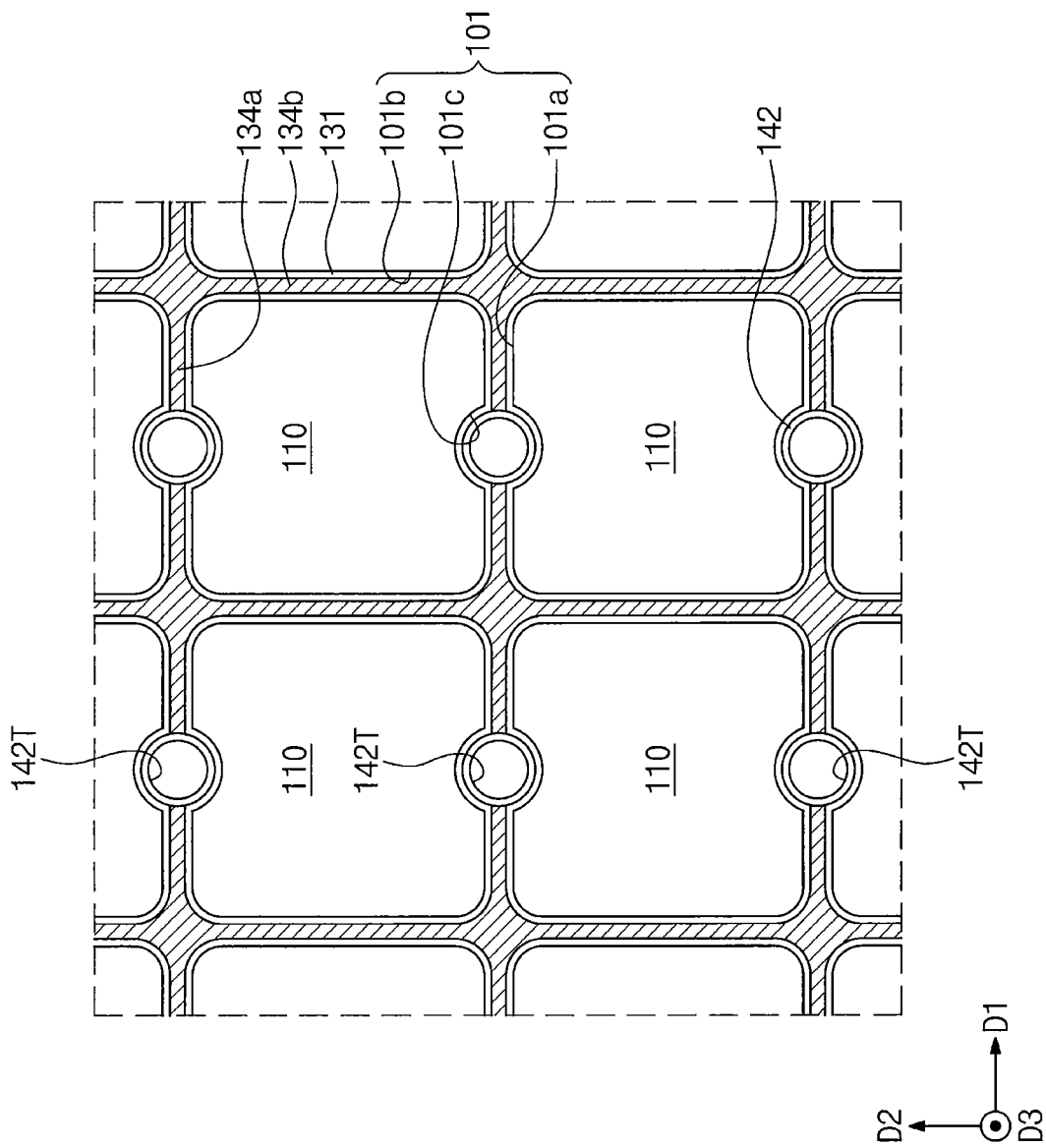
Figure 16A:
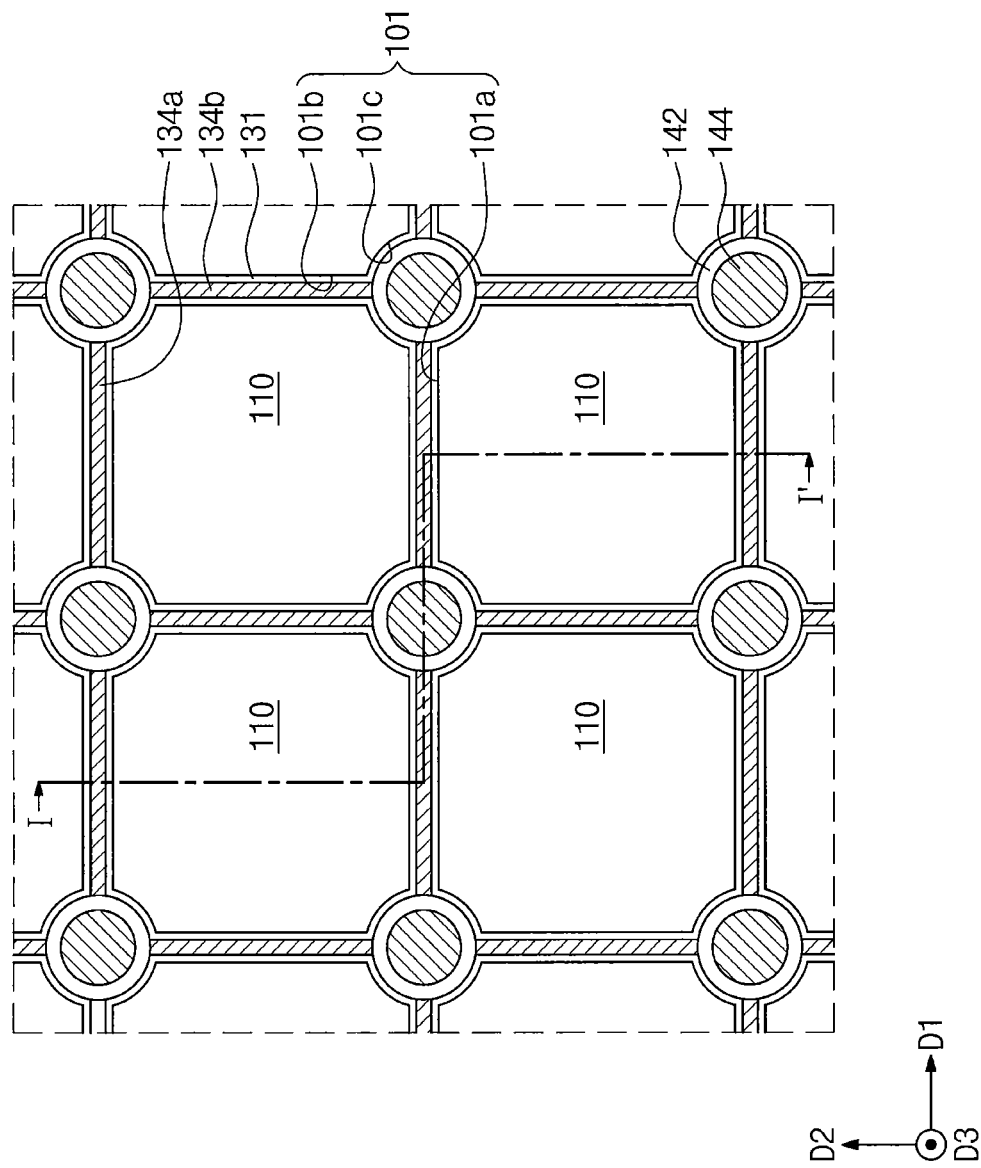
Figure 16B:
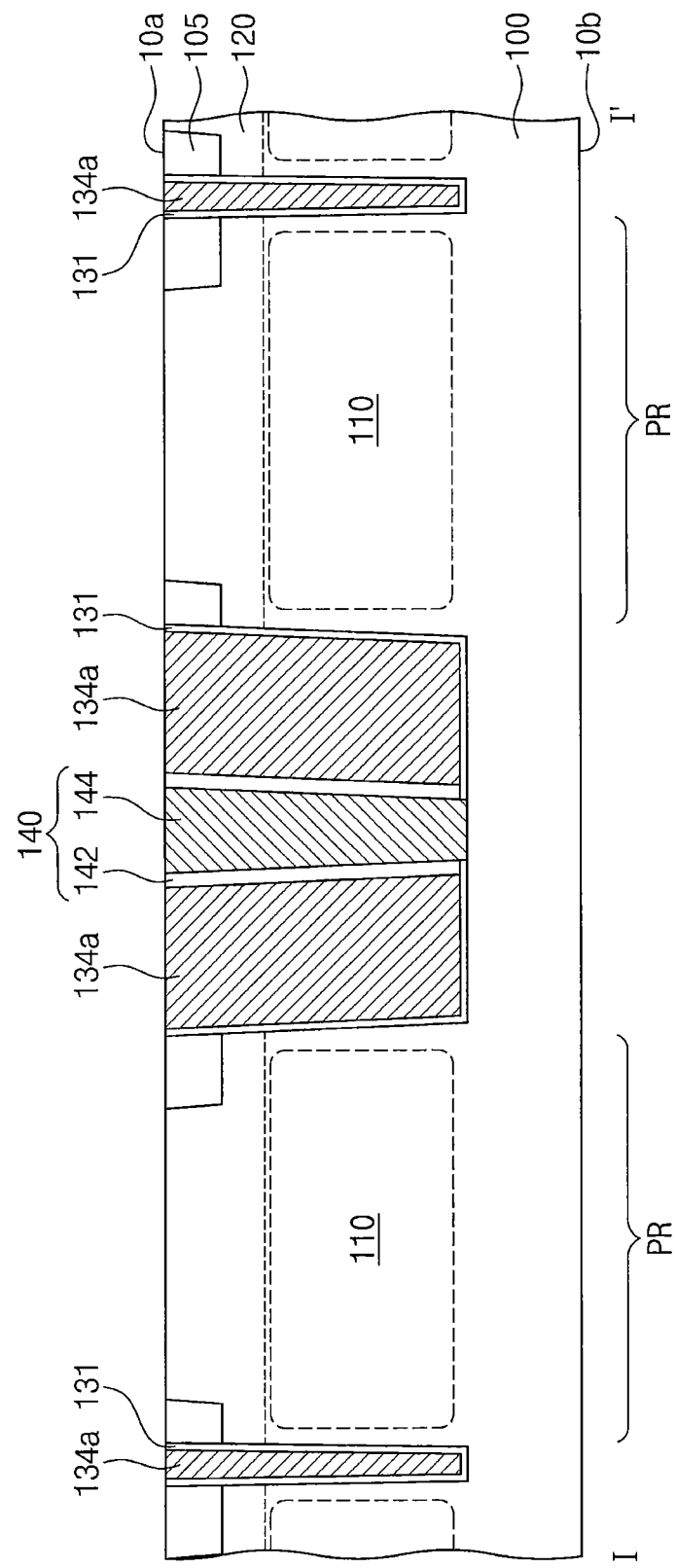
Figure 16C:
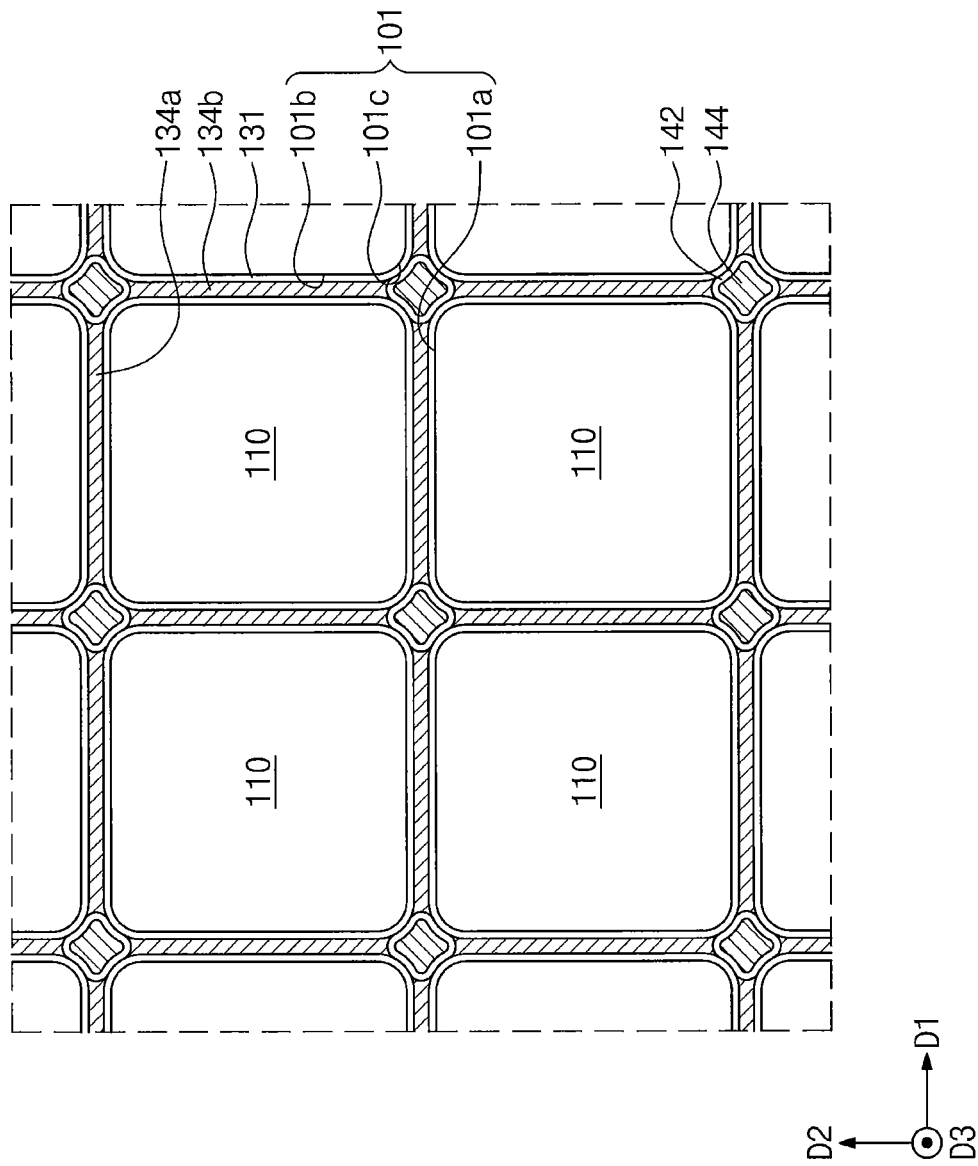
Figure 16D:
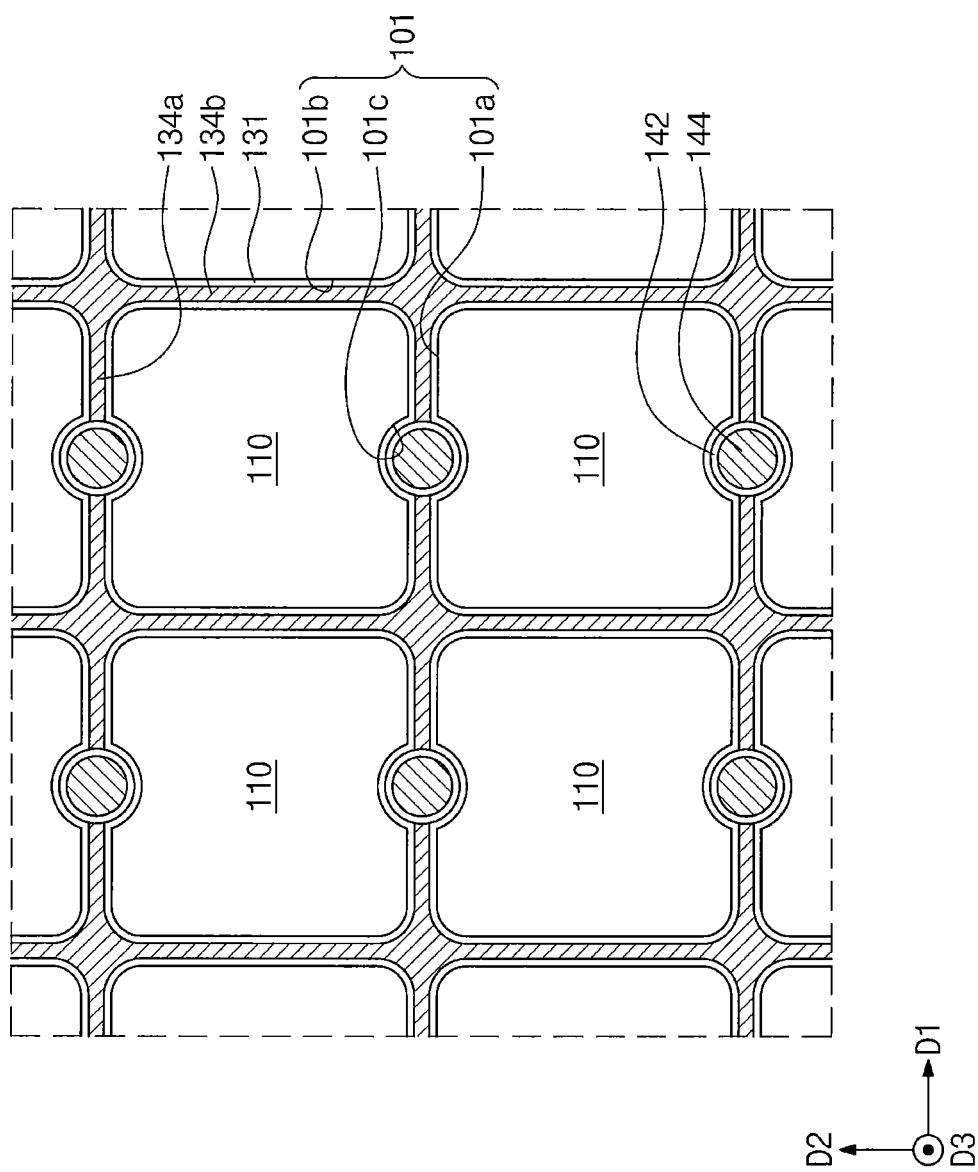

In the embodiments shown in FIGS. 15A and 15B, the thickness of the second sidewall dielectric pattern 142 may be greater than that of the first sidewall dielectric layer 131. In the embodiments shown in FIGS. 15C and 15D, the thickness of the second sidewall dielectric pattern 142 may be substantially the same as that of the first sidewall dielectric layer 131.

Referring to FIGS. 16A, 16B, 16C, and 16D, through conductive plugs 144 may be formed in the through regions 142T defined by the second sidewall dielectric pattern 142. The through conductive plugs 144 may directly contact the second sidewall dielectric pattern 142. For example, the second sidewall dielectric pattern 142 may surround a sidewall of each of the through conductive plugs 144.

The through conductive plugs 144 may be two-dimensionally arranged while being spaced apart from each other, and the first sidewall dielectric layer 131 and the second sidewall dielectric pattern 142 may separate the through conductive plugs 144 from the separation conductive patterns 134*a* and 134*b* and the sidewall of the semiconductor substrate 100. The second sidewall dielectric pattern 142 may be disposed between the through conductive plugs 144 and the separation conductive patterns 134*a* and 134*b*, and the first sidewall dielectric layer 131 and the second sidewall dielectric pattern 142 may be disposed between the through conductive plugs 144 and the sidewall of the semiconductor substrate 100.

The formation of the through conductive plugs 144 may include depositing a buried conductive layer to fill the deep trench 101 in which the second sidewall dielectric pattern 142 is formed, and then performing a planarization process on the buried conductive layer. Before the planarization process is performed to form the through conductive plugs 144, the mask pattern MP may be removed to expose the first surface 10a of the semiconductor substrate 100. The planarization process may cause the through conductive plugs 144 to have top surfaces at substantially the same level as that of top surfaces of the separation conductive patterns 134a and 134b.

The through conductive plugs 144 may include a different conductive material from that of the separation conductive patterns 134a and 134b. The through conductive plugs 144 may include, for example, a metal layer or a polysilicon layer doped with impurities of a second conductivity.

Figure 17A:
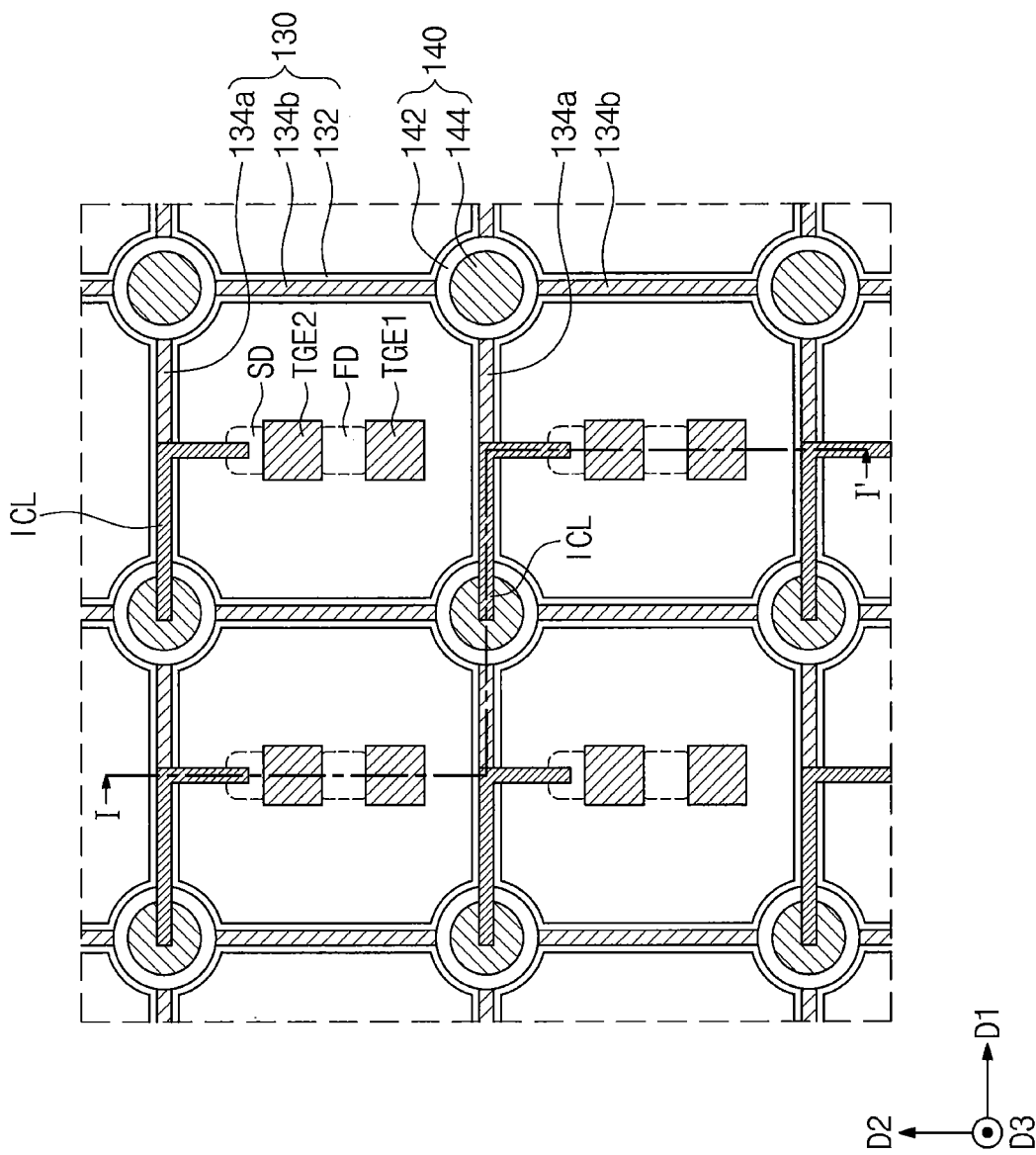
Figure 17B:
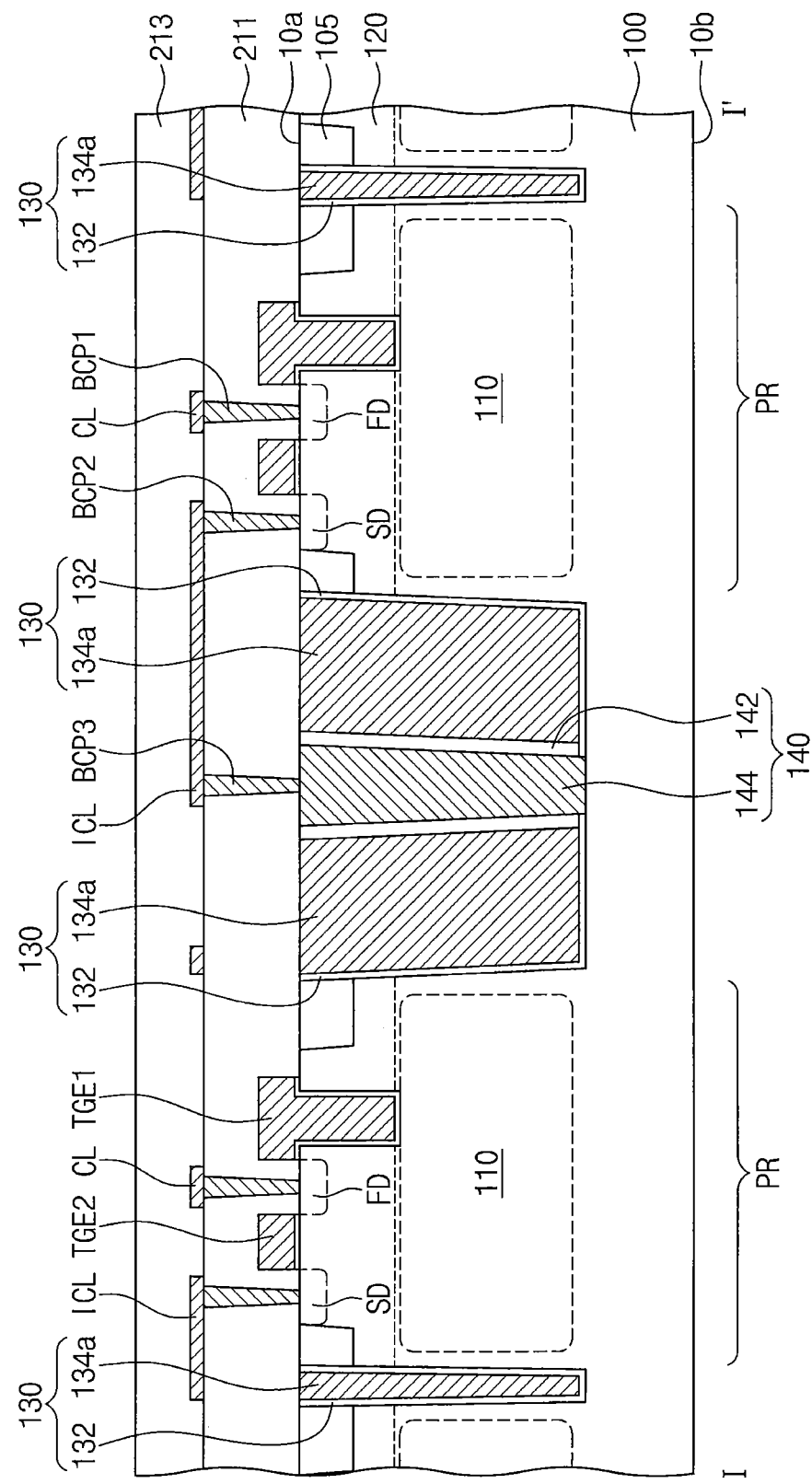

Referring to FIGS. 17A and 17B, metal oxide semiconductor (MOS) transistors may be formed to constitute readout circuits on the first surface 10a of the semiconductor substrate 100.

For example, first and second transfer gate electrodes TGE1 and TGE2 may be formed by patterning the first surface 10a of the semiconductor substrate 100 to form a gate recess on each of the pixel regions PR, forming a gate dielectric layer to conformally cover an inner wall of the gate recess and the first surface 10a of the semiconductor substrate 100, forming a gate conductive layer to fill the gate recess, and patterning the gate conductive layer. Each of the first transfer gate electrodes TGE1 may have a structure inserted into the first surface 10a of the semiconductor substrate 100, and may have a bottom surface at a level lower than that of the first surface 10a of the semiconductor substrate 100. The second transfer gate electrode TGE2 may be disposed on the first surface 10a of the semiconductor substrate 100, while being spaced apart from the first transfer gate electrode TGE1.

A floating diffusion region FD and a charge storage impurity region SD may be formed in the well impurity region 120 on sides of the first and second transfer gate electrodes TGE1 and TGE2. The floating diffusion region FD and the charge storage impurity region SD may be formed by implanting impurities of the second conductivity.

Lower dielectric layers 211 and 213, bottom contact plugs BCP1, BCP2, and BCP3, and connection lines IC and CL may be formed on the first surface 10a of the semiconductor substrate 100.

The lower dielectric layers 211 and 213 may cover the first and second transfer gate electrodes TGE1 and TGE2 and gate electrodes of the MOS transistors constituting the readout circuits. A first lower dielectric layer 211 may cover the top surfaces of the separation conductive patterns 134a and 134b and the top surfaces of the through conductive plugs 144.

The lower dielectric layers 211 and 213 may be formed of a material having superior gap-fill characteristics, and upper portions of the lower dielectric layers 211 and 213 may be planarized. The lower dielectric layers 211 and 213 may include, for example, HDP (high density plasma), TOSZ (tonen silazene), SOG (spin on glass), or USG (undoped silica glass).

The formation of the bottom contact plugs BCP1, BCP2, and BCP3 may include patterning the first lower dielectric layer 211 to form contact holes exposing the floating diffusion region FD, the charge storage impurity region SD, and the through conductive plug 144, and then filling the contact holes with a conductive material. In some example embodiments, a silicide layer may be formed between each of the bottom contact plugs BCP1, BCP2, and BCP3 and each of the floating diffusion region FD, the charge storage impurity region SD, and the through conductive plug 144. In some example embodiments, the bottom contact plugs BCP1, BCP2, and BCP3 may include a first bottom contact plug BCP1 connected to the floating diffusion region FD, a second bottom contact plug BCP2 connected to the charge storage impurity region SD, and a third bottom contact plug BCP3 connected to the through conductive plug 144.

After the bottom contact plugs BCP1, BCP2, and BCP3 are formed, the connection lines ICL and CL may be formed on the first lower dielectric layer 211. The formation of the connection lines ICL and CL may include forming a conductive layer on the first lower dielectric layer 211, and then patterning the conductive layer.

The bottom contact plugs BCP1, BCP2, and BCP3 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or a combination thereof.

Referring to FIG. 18, a thinning process may be perform to remove a portion of the semiconductor substrate 100, and thus the semiconductor substrate 100 may decrease in vertical thickness. The thinning process may include performing a grinding or polishing process on the second surface 10b of the semiconductor substrate 100, and performing an anisotropic or isotropic etching process on the second surface 10b of the semiconductor substrate 100. The semiconductor substrate 100 may be upside down to perform the thinning process on the semiconductor substrate 100. The grinding or polishing process may be performed to remove a portion of the semiconductor substrate 100, and then the anisotropic or isotropic etching process may be perform to remove surface defects remaining on the semiconductor substrate 100.

In some example embodiments, the thinning process on the second surface 10b of the semiconductor substrate 100 may expose bottom surfaces of the separation conductive patterns 134a and 134b and bottom surfaces of the through conductive plugs 144. The thinning process on the semiconductor substrate 100 may remove the first sidewall dielectric layer 131 from a floor surface of the deep trench 101, with the result that a first sidewall dielectric pattern 132 may be formed. The bottom surfaces of the separation conductive patterns 134a and 134b and the bottom surfaces of the through conductive plugs 144 may be located at substantially the same level as that of the second surface 10b of the semiconductor substrate 100.

Referring to FIG. 19, a buffer dielectric layer 221 may be formed on the second surface 10b of the semiconductor substrate 100. The buffer dielectric layer 221 may cover the bottom surfaces of the separation conductive patterns 134a and 134b and the bottom surfaces of the through conductive plugs 144. The buffer dielectric layer 221 may be formed by depositing metal oxide such as aluminum oxide and/or hafnium oxide.

Color filters C/F corresponding to the pixel regions PR may be formed on the buffer dielectric layer 221. The color filters C/F may include blue color filters and red color filters. A first upper dielectric layer 223 may be formed to cover the color filters C/F on the buffer dielectric layer 221.

The first upper dielectric layer 223 may be patterned to form contact holes exposing the through conductive plugs 144, and top contact plugs TCP may be formed in the contact holes.

Referring back to FIGS. 4, 5A, 5B, and 5C, after the top contact plugs TCP are formed, bottom electrodes BE may be formed on the first upper dielectric layer 223 of the pixel regions PR. The formation of the bottom electrodes BE may include depositing a transparent conductive layer on the first upper dielectric layer 223, and then patterning the transparent conductive layer. When viewed in plan, the bottom electrodes BE may correspond to the pixel regions PR. Each of the bottom electrodes BE may be connected to a corresponding one of the top contact plugs TCP.

An organic photoelectric conversion layer OPL, a top electrode TE, and a second upper dielectric layer 225 may be sequentially formed on the bottom electrodes BE.

When viewed in plan, the organic photoelectric conversion layer OPL and the top electrode TE may overlap a plurality of photoelectric conversion regions 110. The organic photoelectric conversion layer OPL may include an organic material that selectively absorbs a light having a specific wavelength and causes photoelectric conversion. The top electrode TE may be formed by depositing a transparent conductive layer on the organic photoelectric conversion layer OPL.

Micro-lenses ML corresponding to the pixel regions PR may be formed on the second upper dielectric layer 225.

According to some example embodiments inventive concepts, pixel regions may be defined by a pixel separation structure and a through electrode structure, and may be completely separated from each other by the pixel separation structure and the through electrode structure, without any semiconductor material between the pixel regions. A crosstalk may thus be limited and/or prevented from being occurred between neighboring pixel regions. As a result, sharp images may be produced on an image sensor according to some example embodiments inventive concepts.

Although inventive concepts have been described in connection with some example embodiments illustrated in the accompanying drawings, it will be understood to those skilled in the art that various changes and modifications may be made without departing from the scope and spirit inventive concepts.

What is claimed is:

1. An image sensor, comprising:
a semiconductor substrate, the semiconductor substrate having a first surface and a second surface opposite each other, the semiconductor substrate including a photoelectric conversion region in the semiconductor substrate;
an organic photoelectric conversion device on the first surface of the semiconductor substrate;
a through electrode structure connected to the organic photoelectric conversion device; and
a pixel separation structure extending from the first surface toward the second surface of the semiconductor substrate,
the pixel separation structure surrounding the photoelectric conversion region when viewed in plan,
the pixel separation structure including a separation conductive pattern and a first sidewall dielectric pattern,
a portion of the pixel separation structure penetrated by the through electrode structure, and
the first sidewall dielectric pattern continuously extending from between the separation conductive pattern and the semiconductor substrate to between the semiconductor substrate and a sidewall of the through electrode structure.

2. The image sensor of claim 1, wherein
the pixel separation structure has a first width, and
the through electrode structure has a second width greater than the first width.

3. The image sensor of claim 1, wherein
the pixel separation structure includes a plurality of first parts and a plurality of second parts,
the plurality of first parts extend in a first direction and are spaced apart from each other in a second direction intersecting the first direction; and
the plurality of second parts extend in the second direction and are spaced apart from each other in the first direction, and
when viewed in plan, the photoelectric conversion region is between a pair of the plurality of first parts and between a pair of the plurality of second parts.

4. The image sensor of claim 1, wherein
the separation conductive pattern includes a plurality of first separation conductive patterns and a plurality of second separation conductive patterns,
the plurality of first separation conductive patterns extend in a first direction,
the plurality of second separation conductive patterns extend in a second direction intersecting the first direction, and
the first sidewall dielectric pattern extends in the first direction and the second direction.

5. The image sensor of claim 4, wherein the through electrode structure contacts the plurality of first separation conductive patterns in the first direction and the plurality of second separation conductive patterns in the second direction.

6. The image sensor of claim 4, wherein the through electrode structure is connected in the first direction to the plurality of first separation conductive patterns and spaced apart in the second direction from the plurality of second separation conductive patterns.

7. The image sensor of claim 1, wherein
the through electrode structure includes a through conductive plug and a second sidewall dielectric pattern, and
the second sidewall dielectric pattern surrounds a sidewall of the through conductive plug.

8. The image sensor of claim 7, wherein a thickness of the second sidewall dielectric pattern is different from a thickness of the first sidewall dielectric pattern.

9. The image sensor of claim 7, wherein a width of the through conductive plug is greater than a width of the separation conductive pattern.

10. An image sensor, comprising:
a semiconductor substrate having a first surface and a second surface opposite each other,
the semiconductor substrate including a plurality of photoelectric conversion regions in the semiconductor substrate, the plurality of photoelectric conversion regions arranged in a first direction and a second direction intersecting each other when viewed in plan;
a pixel separation structure extending from the first surface toward the second surface of the semiconductor substrate, the pixel separation structure surrounding each of the plurality of photoelectric conversion regions when viewed in plan;
an organic photoelectric conversion device on the first surface of the semiconductor substrate; and a through electrode structure penetrating the semiconductor substrate, the through electrode structure connected to the organic photoelectric conversion device, an outer sidewall of the through electrode structure being connected to the pixel separation structure.

11. The image sensor of claim 10, wherein the pixel separation structure has a first width, and the through electrode structure has a second width greater than the first width.

12. The image sensor of claim 10, wherein the pixel separation structure includes a plurality of first parts and a plurality of second parts, the plurality of first parts extend in the first direction and are spaced apart from each other in the second direction, the plurality of second parts extend in the second direction and are spaced apart from each other in the first direction, and when viewed in plan, each of the plurality of photoelectric conversion regions is between a pair of the plurality of first parts and between a pair of the plurality of second parts.

13. The image sensor of claim 10, wherein the pixel separation structure includes a separation conductive pattern and a first sidewall dielectric pattern, the first sidewall dielectric pattern is between the separation conductive pattern and the semiconductor substrate, and the through electrode structure penetrates a portion of the separation conductive pattern.

14. An image sensor, comprising:

a semiconductor substrate having a first surface and a second surface opposite each other, the semiconductor substrate including a trench extending from the first surface toward the second surface of the semiconductor substrate, the trench including a plurality of first regions, a plurality of second regions, and a connection region, the plurality of first regions extending in a first direction and each having a first width, the plurality of second regions extending in a second direction intersecting the first direction and each having a second width, and the connection region between the first regions and having a third width greater than the first width;

a plurality of separation conductive patterns in the plurality of first regions and the plurality of second regions of the trench;

a first sidewall dielectric pattern between the plurality of separation conductive patterns and a sidewall of the trench;

a through conductive plug in the connection region of the trench; and a second sidewall dielectric pattern surrounding a sidewall of the through conductive plug and contacting the plurality of separation conductive patterns.

15. The image sensor of claim 14, wherein a portion of the second sidewall dielectric pattern is between the first sidewall dielectric pattern and the through conductive plug.

16. The image sensor of claim 14, wherein the second sidewall dielectric pattern is spaced apart from the sidewall of the trench.

17. The image sensor of claim 14, wherein each of the plurality of separation conductive patterns has a width less than a width of the through conductive plug.

18. The image sensor of claim 14, wherein the second sidewall dielectric pattern extends in the first direction and the second direction.

19. The image sensor of claim 14, wherein the through conductive plug includes a conductive material different from a conductive material of each of the plurality of separation conductive patterns.

20. The image sensor of claim 14, further comprising:

an organic photoelectric conversion device on the first surface of the semiconductor substrate, the organic photoelectric conversion device being connected to the through conductive plug.

* * * * *